US011761705B2

(12) United States Patent
Breon et al.

(10) Patent No.: US 11,761,705 B2
(45) Date of Patent: *Sep. 19, 2023

(54) NATURAL GAS LETDOWN GENERATOR SYSTEM AND METHOD

(71) Applicant: Magellan Scientific, LLC, Akron, OH (US)

(72) Inventors: Brent Breon, Uniontown, OH (US); Christopher Halvorson, Akron, OH (US)

(73) Assignee: Magellan Scientific, LLC, Akron, OH (US)

(*) Notice: Subject to any disclaimer, the term of this patent is extended or adjusted under 35 U.S.C. 154(b) by 0 days.

This patent is subject to a terminal disclaimer.

(21) Appl. No.: 18/060,994

(22) Filed: Dec. 2, 2022

(65) Prior Publication Data

US 2023/0131311 A1 Apr. 27, 2023

Related U.S. Application Data

(63) Continuation of application No. 17/972,240, filed on Oct. 24, 2022.

(Continued)

(51) Int. Cl.
*H05K 7/20* (2006.01)
*F25J 1/02* (2006.01)
(Continued)

(52) U.S. Cl.
CPC .............. *F25J 1/0232* (2013.01); *F17D 1/04* (2013.01); *F25J 1/0022* (2013.01); *F25J 1/0248* (2013.01); *F25J 2240/40* (2013.01)

(58) Field of Classification Search
CPC .. H05K 7/20827; H05K 7/20218; H05K 7/20; H05K 7/20127; H05K 7/20709;
(Continued)

(56) References Cited

U.S. PATENT DOCUMENTS 5,948,221 A 9/1999 Hsu
7,278,273 B1 * 10/2007 Whitted ................. H01R 43/26
62/414

(Continued)

FOREIGN PATENT DOCUMENTS

WO 2018201095 A1 11/2018
WO 2020128400 A1 6/2020

OTHER PUBLICATIONS

The International Search Report and The Written Opinion of the International Searching Authority, or Declaration for corresponding PCT Application No. PCT/US2022/047610, dated Feb. 17, 2023, 14 pages.

(Continued)

Primary Examiner — Kaity V Chandler
(74) Attorney, Agent, or Firm — Tucker Ellis LLP; Heather M. Barnes; Nathan C. Lovette

(57) ABSTRACT

Provided herein are systems and methods for utilizing a natural gas letdown generator at a natural gas regulating station. The system utilizes the gas letdown generator to generate electricity by converting high pressure inlet gas to low pressure outlet gas, which in turn creates low temperature outlet gas. Electricity generated can power a data center. Heat may be transferred, using a heat exchanger, from dielectric fluid of the data center to the natural gas prior to entering the gas letdown generator. Heat may be further transferred, using a second heat exchanger, from the dielectric fluid to the natural gas at the output of the gas letdown generator. The heat exchange may substantially cool the dielectric fluid for transmission to the data center and may heat the low temperature outlet gas for transmission to an end user.

20 Claims, 11 Drawing Sheets

Related U.S. Application Data

(60) Provisional application No. 63/270,884, filed on Oct. 22, 2021.

(51) Int. Cl.
 *F17D 1/04* (2006.01)
 *F25J 1/00* (2006.01)

(58) Field of Classification Search
 CPC ......... Y02E 60/50; Y02E 60/32; Y02E 20/14; Y02E 60/14; Y02E 60/36; Y02E 40/60; Y02E 50/30; Y02E 30/30; Y02E 10/46; Y02E 20/34; Y02E 50/10; Y02E 60/10; Y02E 10/30; Y02E 20/16; Y02E 20/18; Y02E 20/30; Y02E 10/10; Y02E 10/40; Y02E 10/50; Y02E 20/32; Y02E 60/16; Y02E 10/20; Y02E 10/44; Y02E 10/56; Y02E 30/00; Y02E 60/13; Y02E 60/34; F17D 3/01; F17D 1/02; F17D 1/05; F17D 1/082; F17D 1/13; F17D 1/14; F17D 1/16; F25J 2200/08; F25J 2200/50; F25J 2200/80; F25J 2205/02; F25J 2205/04; F25J 2205/10; F25J 2205/60; F25J 2205/66; F25J 2205/82; F25J 2210/04; F25J 2210/60; F25J 2215/42; F25J 2215/64; F25J 2215/66; F25J 2220/04; F25J 2220/68; F25J 2230/08; F25J 2235/04; F25J 2240/30; F25J 2240/44; F25J 2240/90; F25J 2250/20; F25J 2260/02; F25J 2260/20; F25J 2270/04; F25J 2270/18; F25J 2270/902; F25J 2270/904; F25J 2270/912; F25J 2280/40; F25J 3/0238; F25J 3/0242; F25J 3/0266; F25J 3/06; F25J 3/065; F25J 5/00; F25J 5/002; F25J 1/0022; F25J 2290/62; F25J 1/0052; F25J 1/0025; F25J 1/0045; F25J 1/0202; F25J 1/004; F25J 2290/34; F25J 1/00; F25J 1/023; F25J 1/0277; F25J 2270/90; F25J 1/0245; F25J 2270/42; F25J 2210/06; F25J 2230/30; F25J 2250/02; F25J 2270/12; F25J 1/0087; F25J 1/0035; F25J 1/0204; F25J 1/0085; F25J 1/0208; F25J 1/021; F25J 1/0261; F25J 1/0262; F25J 1/0268; F25J 1/0284; F25J 2220/62; F25J 3/0209; F25J 1/0212; F25J 1/0236; F25J 1/0247; F25J 1/025; F25J 1/0257; F25J 1/0265; F25J 1/0288; F25J 2200/02; F25J 2205/20; F25J 2215/62; F25J 2220/82; F25J 2230/22; F25J 1/001; F25J 1/0072; F25J 1/0082; F25J 1/0201; F25J 1/0251; F25J 1/0254; F25J 1/0263; F25J 1/0292; F25J 3/0257; F25J 3/029; F25J 3/061; F25J 3/062; F25J 3/0665; F25J 3/0695; F25J 3/08; F25J 1/0007; F25J 1/0015; F25J 1/0017; F25J 1/0037; F25J 1/005; F25J 1/0055; F25J 1/02; F25J 1/0205; F25J 1/0237; F25J 1/0258; F25J 1/0264; F25J 1/0275; F25J 1/0279; F25J 1/0283; F25J 1/0296; F25J 1/0298; F25J 2200/70; F25J 2200/72; F25J 2200/74; F25J 2200/76; F25J 2205/40; F25J 2210/02; F25J 2210/42; F25J 2210/62; F25J 2210/90; F25J 2215/10; F25J 2230/32; F25J 2235/42; F25J 2240/40; F25J 2245/02; F25J 2270/14; F25J 2270/66; F25J 2280/30; F25J 2290/32; F25J 3/02; F25J 3/0247; F25J 3/0635; F25J 3/069; F25J 1/0012; F25J 1/0057; F25J 1/0092; F25J 1/0095; F25J 1/0097; F25J 1/0214; F25J 1/0218; F25J 1/0219; F25J 1/0231; F25J 1/0232; F25J 1/0248; F25J 1/0267; F25J 1/0271; F25J 1/0274; F25J 1/0278; F25J 1/0289; F25J 1/029; F25J 1/0294; F25J 1/0295; F25J 2210/70; F25J 2220/02; F25J 2220/64; F25J 2220/80; F25J 2220/84; F25J 2230/20; F25J 2235/60; F25J 2240/02; F25J 2270/02; F25J 2270/60; F25J 2290/40; F25J 3/0233; F25J 3/066; F25J 3/067; F25J 5/005; F25J 1/0042; F25J 1/0075; F25J 1/0216; F25J 1/0221; F25J 1/0224; F25J 1/0259; F25J 1/0281; F25J 2205/24; F25J 2205/84; F25J 2205/86; F25J 2215/04; F25J 2215/14; F25J 2215/30; F25J 2215/80; F25J 2230/60; F25J 2245/90; F25J 2260/44; F25J 2260/80; F25J 2270/80; F25J 2280/10; F25J 2290/30; F25J 2290/44; F28F 17/00; F28F 9/0229; F28F 9/26; F28F 1/42; F28F 19/00; F28F 19/01; F28F 19/02; F28F 21/04; F28F 21/08; F28F 21/087; F28F 3/00; F28F 9/02; F28C 3/08
 See application file for complete search history.

(56) References Cited

U.S. PATENT DOCUMENTS

| | | | |
|---|---|---|---|
| 7,605,326 B2 | 10/2009 | Anderson | |
| 9,624,913 B2 | 4/2017 | Friesth | |
| 10,018,114 B2 | 7/2018 | Wardle et al. | |
| 10,060,296 B2 | 8/2018 | Friedth | |
| 11,129,298 B2 | 9/2021 | Enright et al. | |
| 2008/0204999 A1* | 8/2008 | Clidaras | H05K 7/20836 361/696 |
| 2009/0313995 A1 | 12/2009 | Zakrzewski | |
| 2012/0035773 A1* | 2/2012 | Stabinski | H05K 7/20836 700/282 |
| 2013/0209838 A1* | 8/2013 | Manna | H01M 10/6567 429/7 |
| 2015/0196002 A1 | 7/2015 | Friesth | |
| 2016/0143191 A1 | 5/2016 | Smith | |
| 2016/0369692 A1 | 12/2016 | Wardle et al. | |
| 2017/0204806 A1 | 7/2017 | Friesth | |
| 2017/0303434 A1 | 10/2017 | Katsmuata et al. | |
| 2021/0104764 A1 | 4/2021 | Allo | |

OTHER PUBLICATIONS

"Could Langson Energy Have a Solution to the Worldwide Energy Crisis at DataCenters with Its Gas Letdown Generator?," Langson Energy, Inc., Aug. 19, 2021, 3 pages, Retrieved from Internet: <URL:https://www.pr.com/press-release/842394>.

"Langson Energy Pressure to Power, Gas Pressure to Green Energy, Gas Letdown Generator for Data Centers," www.LangsonEnergy.com, 5 pages, Retrieved from Internet: <URL:extension://elhekieabhbkpmcefcoobjddigjcaadp/https://img.pr.com/release-file/2108/842394/WhitePaper-GLGforDataCenters.pdf>, Aug. 19, 2021.

* cited by examiner

NATURAL GAS LETDOWN GENERATOR SYSTEM AND METHOD

CROSS-REFERENCE TO RELATED APPLICATIONS

This application is a continuation application of U.S. Non-Provisional patent application Ser. No. 17/972,240 filed on Oct. 24, 2022 and entitled "Natural Gas Letdown Generator System and Method." application Ser. No. 17/972,240 claims priority to U.S. Provisional Patent Application Ser. No. 63/270,884 filed on Oct. 22, 2021 and entitled "Letdown Generator for Data Center." The above-mentioned applications are incorporated herein by reference in their entireties.

BACKGROUND

Natural gas is often transported between various locations around the globe via natural gas pipelines. It is common for natural gas to be transported at high pressures for efficiency, and compression stations are utilized to maintain proper pressure throughout the natural gas pipeline and help the natural gas transportation process. The pressure that the natural gas is transported at in transmission pipelines is typically too high for distribution pipeline system that supply end users. Natural gas pressure letdown stations, also known as regulating stations, utilize natural gas heaters, valves, filters, and regulators to safely reduce gas pressures from high pressure to low pressure suitable for end use.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

One or more techniques and systems described herein can be utilized to reduce energy loss or harness energy released at natural gas regulation stations using a natural gas letdown generator. Techniques and systems described herein can be utilized to power and cool components of an immersion data center. Additionally, one or more techniques and systems described herein can also be utilized to regulate (e.g., decrease or letdown) natural gas pressures and provide heat to the natural gas stream.

By way of example, a natural gas letdown generator may be utilized at a natural gas regulation station to harness energy released by the regulation station during the letdown (depressurization) process of the natural gas. The letdown generator may generate electricity to power an immersion data center that transfers heat from the data center to a natural gas stream as a form of pre-heating or post-heating in heat exchangers to reduce natural gas consumption at the regulation station and thereby reduce scope 1 emissions. In another implementation, the letdown generator may provide renewable energy credits that may be used to help reduce scope 2 emissions by utilizing carbon offsets.

In an implementation, a natural gas system comprises a supply of high pressure natural gas, a letdown generator comprising an inlet configured to accept a portion of natural gas from the supply of high pressure natural gas, the natural gas entering the inlet at a first temperature and a first pressure, and an outlet configured to output the natural gas from the letdown generator at a second pressure lower than the first pressure and a second temperature lower than the first temperature, wherein the letdown generator is configured to reduce the pressure of the natural gas and generate electricity, a first heat exchanger in fluid connection with the inlet of the letdown generator, the first heat exchanger configured to transfer heat to the natural gas, and an electric heater configured to provide heat to the natural gas via the first heat exchanger, wherein the electric heater is powered by the electricity generated by the letdown generator.

In an implementation, the first heat exchanger is located upstream of the letdown generator and is configured to transfer heat from the electric heater to the natural gas before the natural gas enters the inlet of the letdown generator.

In an implementation, the natural gas system further comprises a second heat exchanger located downstream of the letdown generator, the second heat exchanger configured to transfer heat from the electric heater to the natural gas after the natural gas exits the output of the letdown generator.

In an implementation, the natural gas system is configured to heat the natural gas above a pre-determined temperature setpoint.

In an implementation, the natural gas system further comprises a coolant loop filled with a coolant, the coolant loop configured to circulate the coolant between the electric heater and at least one of the first heat exchanger or the second heat exchanger.

In an implementation, the natural gas system further comprises an immersion data center comprising a body filled with a dielectric fluid, wherein at least one electrical component is immersed at least partially in the dielectric fluid and the immersion data center powered by electricity generated by the letdown generator.

In an implementation, an amount of power generated from the letdown generator is greater than a power consumption of the data center thereby creating a surplus of power, the system configured to send the surplus of power to the electric heater such that the surplus of power is converted to heat.

In an implementation, the natural gas system further comprises a coolant loop filled with a coolant, the coolant loop configured to circulate the coolant between the data center and the first heat exchanger.

In an implementation, the natural gas system further comprises a third heat exchanger located at the data center, the third heat exchanger configured to transfer heat from the dielectric fluid of the data center to the coolant.

In an implementation, the electric heater is in fluid connection with the coolant loop and is located between the first heat exchanger and the data center.

In an implementation, the natural gas is heated entirely by either heating provided by the data center or the electric heater.

In an implementation, a method of controlling a natural gas letdown station may be provided, the natural gas letdown station comprises a supply of high pressure natural gas, a letdown generator comprising an inlet and an outlet, the inlet configured to accept a portion of natural gas from the supply of high pressure natural gas and an output configured to output the natural gas at a lower temperature and lower pressure, wherein the letdown generator is configured to reduce the pressure of the natural gas and generate electricity, a first heat exchanger in fluid connection with the inlet of the letdown generator, the first heat exchanger configured to transfer heat to the natural gas, and an electric heater powered by electricity generated by the letdown generator and configured to provide heat to the natural gas via the first heat exchanger, wherein the method comprises:

monitoring a temperature of the natural gas that is exiting the outlet of the letdown generator, determining that the temperature of the natural gas is below a pre-determined temperature setpoint, and upon making the determination that the natural gas is below the pre-determined temperature setpoint, directing an increased amount of electricity from the letdown generator to the electric heater to provide additional heat to the natural gas.

In an implementation, the first heat exchanger is located upstream of the letdown generator and is configured to transfer heat generated from the electric heater to the natural gas before the natural gas enters the inlet of the letdown generator.

In an implementation, the method further comprises determining that the first heat exchanger is operating at maximum capacity, determining that the electric heater is operating at maximum capacity, and upon making the determination that the natural gas is below the pre-determined temperature setpoint and that the first heat exchanger and the electric heater are operating at maximum capacity, activating a gas-fired heater to provide additional heat to the natural gas.

In an implementation, the method further comprises determining that the temperature of the natural gas is above the pre-determined temperature setpoint, and upon making the determination that the natural gas is above the pre-determined temperature setpoint, deactivating the gas-fired heater.

In an implementation, the method further comprises determining that the gas-fired heater is de-activated and that the temperature of the natural gas is above the pre-determined temperature setpoint, and upon making the determination that the gas-fired heater is de-activated and the natural gas is above the pre-determined temperature setpoint, reducing power to the electric heater and re-directing power to earth ground.

In an implementation, a method of controlling a natural gas letdown station is provided, the natural gas letdown station comprises a supply of high pressure natural gas, an immersion data center, comprising a body filled with a dielectric fluid, wherein one or more electrical components are immersed at least partially in the dielectric fluid, a letdown generator comprising an inlet and an outlet, the inlet configured to accept a portion of natural gas from the supply of high pressure natural gas and an output configured to output the natural gas at a lower temperature and lower pressure, wherein the letdown generator is configured to reduce the pressure of the natural gas and generate electricity to power at least a portion of the immersion data center, a first heat exchanger in fluid connection with the inlet of the letdown generator, the first heat exchanger configured to transfer heat from the dielectric fluid of the data center to the natural gas, and an in-line heater located between the first heat exchanger and the data center, the in-line heater powered by electricity generated by the letdown generator and configured to provide heat to the natural gas prior to the inlet of the letdown generator, wherein the method comprises: monitoring a power generated from the letdown generator and a power consumption of the data center, determining whether the power generated from the letdown generator is greater than the power consumption of the data center, upon determining that the power generated from the letdown generator is greater than the power consumption of the center, increasing the power consumption of the data center by placing at least one of the one or more electrical components into an increased power consumption state or by powering on at least one of the one or more electrical components.

In an implementation, the method further comprises determining that the data center is operating at a maximum power consumption, wherein the data center is determined to be operating at the maximum power consumption if the power consumption of the data center cannot be increased to match the power generated from the letdown generator, and upon determining the data center is operating at the maximum power consumption, re-directing a surplus power to either the in-line heater or to earth ground.

In an implementation, the surplus of power is calculated in real-time as the power generated from the letdown generator minus the power consumed by the data center.

In an implementation, the method further comprises determining whether the power generated from the letdown generator is less than the power consumption of the data center, and upon determining that the power generated from the letdown generator is less than the power consumption of the center, decreasing the power consumption of the data center by placing at least one of the one or more electrical components into an decreased power consumption state.

To the accomplishment of the foregoing and related ends, the following description and annexed drawings set forth certain illustrative aspects and implementations. These are indicative of but a few of the various ways in which one or more aspects may be employed. Other aspects, advantages and novel features of the disclosure will become apparent from the following detailed description when considered in conjunction with the annexed drawings.

BRIEF DESCRIPTION OF THE DRAWINGS

What is disclosed herein may take physical form in certain parts and arrangement of parts, and will be described in detail in this specification and illustrated in the accompanying drawings which form a part hereof and wherein.

DETAILED DESCRIPTION

Figure 1:
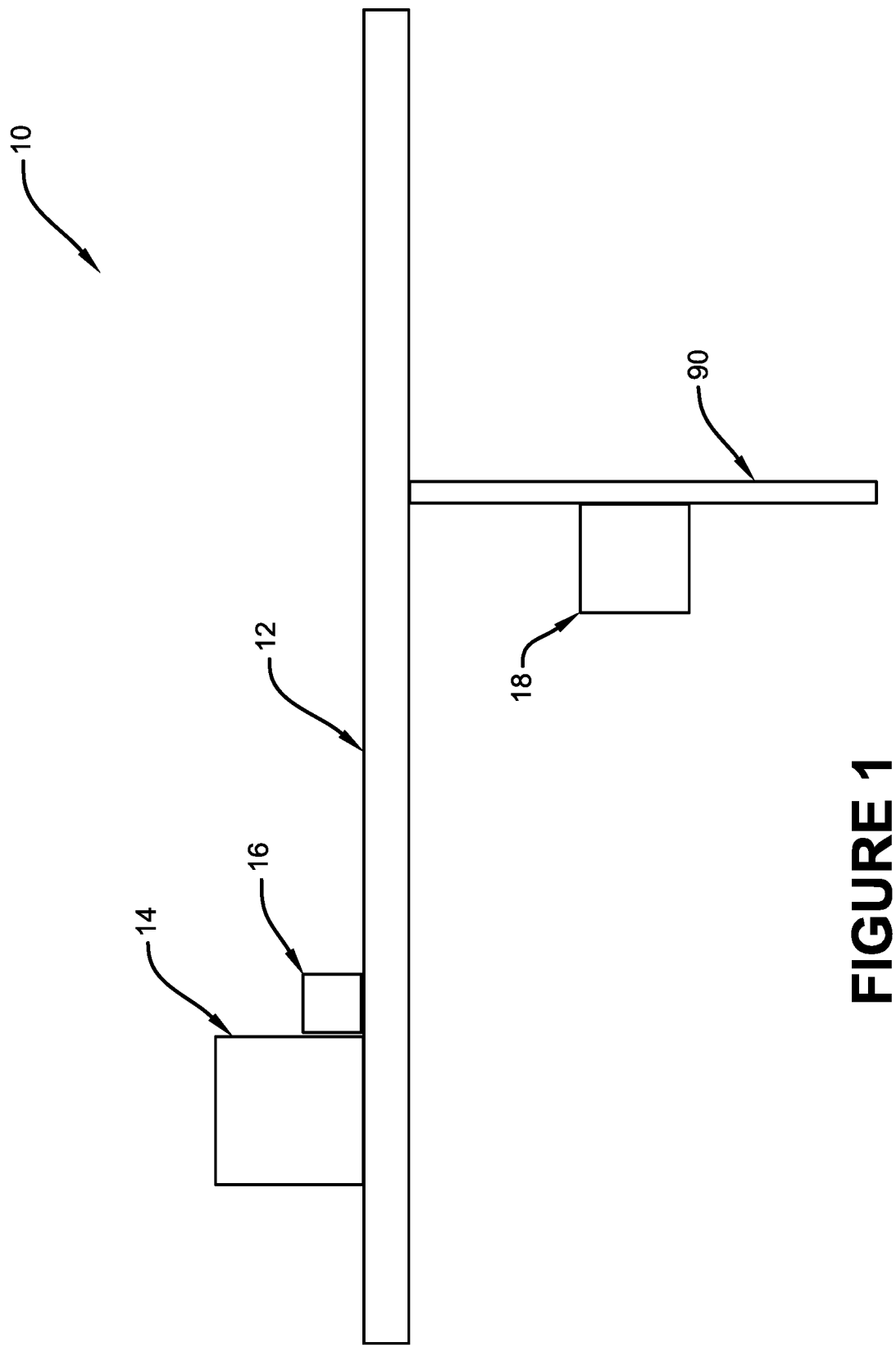
FIG. 1 is an exemplary implementation of a typical natural gas pipeline system as described herein.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are shown in block diagram form in order to facilitate describing the claimed subject matter.

Natural gas is a fossil energy source that is utilized for many industrial, commercial, and household uses. One of the most common methods for transporting natural gas is by pipeline, which requires that the natural gas be pressurized to a high pressure. Compression stations and metering stations are placed throughout the pipeline to ensure proper pressurization for transportation of the natural gas. The compression stations compress the natural gas by turbine, motor, or engine, and metering stations are installed throughout the pipeline to monitor the pressure and flow of the natural gas to verify performance and monitor for leaks.

The pressure at which the natural gas is transported is often too high for use by end users. Therefore, the natural gas must pass through natural gas regulation stations before being ultimately transported downstream to an end user. Natural gas regulation stations reduce the pressure of the natural gas to a pressure suitable for end use and for further transportation to downstream distribution systems. During the depressurization process, the regulation stations release energy in the form of pressure and heat. This energy is often not accounted for or otherwise utilized resulting in significant energy losses and CO2 emissions. Disclosed herein are various methods and systems that may improve efficiency and reduce emissions for natural gas regulation stations.

FIG. 1 illustrates a typical natural gas pipeline system 10. The system 10 may comprise a main natural gas pipeline 12, at least one compression station 14, and at least one metering station 16. The system 10 may further comprise at least one natural gas regulation station (letdown station) 18 feeding a natural gas distribution line 90. In this implementation, natural gas is pressurized at the compression station 14 and transported throughout the pipeline 12. The natural gas regulation (or letdown) station 18 receives at least a portion of the high pressure natural gas from the main pipeline 12. The regulation station 18 reduces the pressure of the natural gas to a pressure suitable for distribution through the distribution line 90 to end users. As disclosed above, energy and emissions are released at the regulation station 18 during the depressurization or letdown process.

Figure 2:
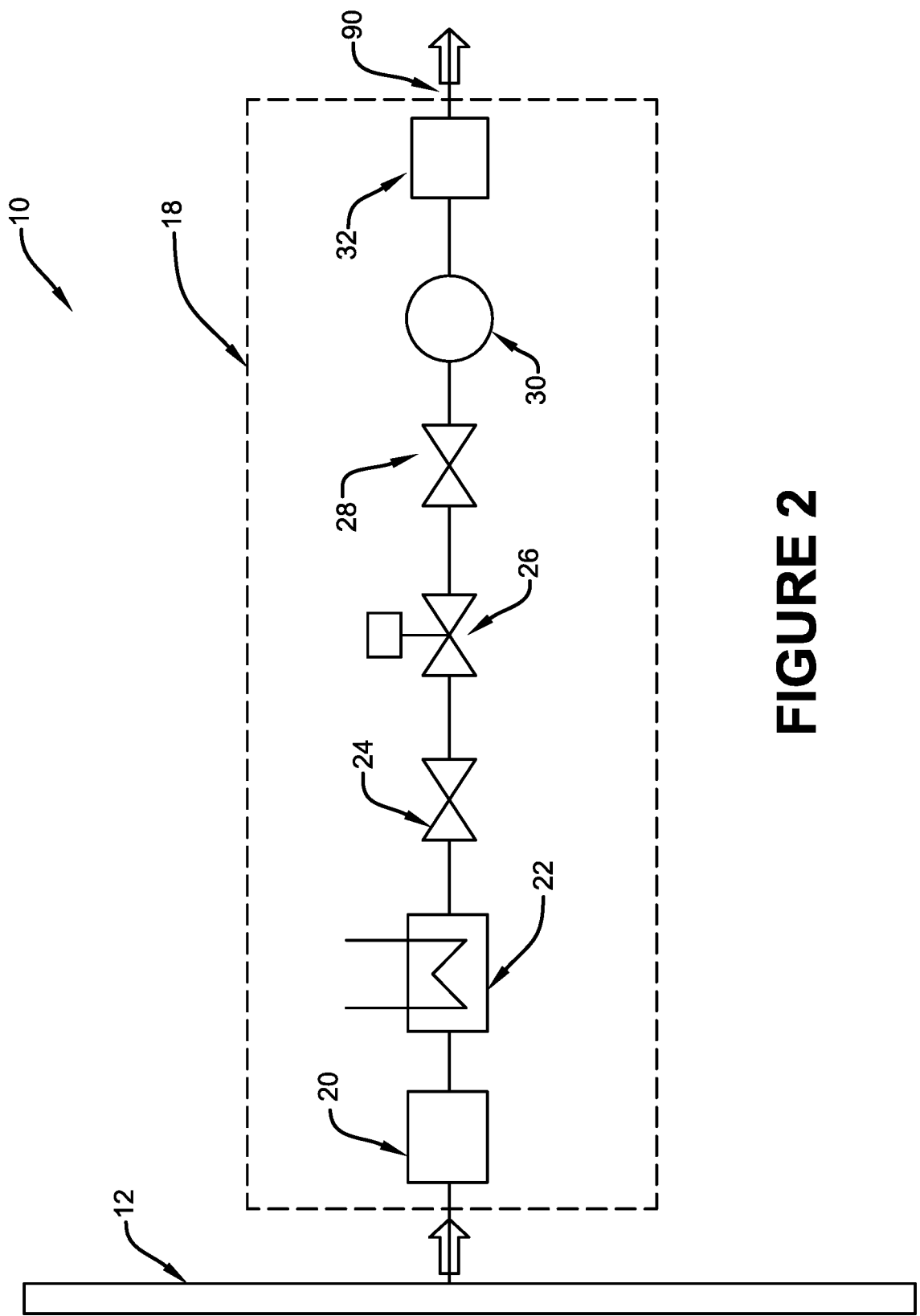
FIG. 2 is an exemplary implementation of a typical natural gas letdown or regulating station as described herein.

FIG. 2 illustrates a typical natural gas regulating or letdown station 18 in further detail. The station 18 can receive high pressure natural gas from a natural gas pipeline 12, and the natural gas can be transmitted to an end user downstream of distribution line 90. The natural gas regulating station 18 (also referred to as a natural gas pressure letdown station) can include a filter 20, a pre-heater 22, a safety shut-off valve 24, a regulator valve 26, a safety relief valve 28, a flow meter or counter 30, and an odorizing system 32. As described above, however, the natural gas regulating station 18 may be inefficient, may waste energy, and may generate CO2 emissions during the letdown or depressurization process.

In an effort to reduce emissions, natural gas pipeline operators and companies may work towards achieving "net zero" carbon dioxide emissions. Net zero emissions can be achieved by reducing direct and indirect carbon dioxide emissions, through the reduction of direct use of natural gas, through the production and retirement of carbon offsets, or a combination of approaches. By way of example, natural gas companies may work to reduce their emissions (e.g., decarbonize) in a variety of ways. This can include reducing natural gas leaks and blowdowns, reducing natural gas-emitting equipment, implementing renewable natural gas to replace natural gas, implementing carbon capture projects, developing renewable power generation, and the like. Natural gas companies may also voluntarily report their emissions in the form of scope 1 (direct use of fossil fuels), scope 2 (indirect use of fossil fuels through purchased energy), or scope 3 emissions (indirect value chain emissions).

Natural gas regulating stations, such as the regulating station 18, may emit multiple forms of greenhouse gas emissions (e.g., in the form of scope 1, scope 2, or scope 3 emissions). For example, the pre-heater 22 and the relief valve 28 can emit scope 1 emissions. Electricity used to power the controls or the counter (e.g., flow meter) for the station 18 can produce scope 2 emissions. The implementations described herein describe various methods and systems that may be used to improve natural gas regulation stations such as the regulation station 18. The implementations may help to reduce greenhouse gas emissions and may help to achieve net zero emission from the regulations stations.

In one implementation, a natural gas letdown generator (GLG) may be utilized at a natural gas regulation station 18 to harness energy produced by the station during the depressurization or letdown process. The energy produced by the letdown generator may be used to help reduce a company's emissions through the reduction of direct use of natural gas, through the production and retirement of carbon offsets, or a combination of approaches. In other examples, the letdown generator may generate electricity to power an immersion data center located proximate the regulation station. Letdown generators may also increase efficiency and profitability by qualifying for state and federal tax credits, infrastructure grants, renewable energy credits, and other incentives.

By way of example, a gas letdown generator is powered by the flow of gas (e.g., natural gas), and may produce electricity using the flow of the natural gas. The letdown generator may utilize a flow turbine or helical screw, or in-line turbo-expander for example, to convert high-pressure gas into lower pressure gas, which in turn may generate electricity. The conversion of the high-pressure inlet gas to low-pressure outlet gas may also result in a significant decrease in temperature of the gas. This is an example of adiabatic expansion and is called the Joule-Thompson effect. In other words, high-pressure, high-temperature natural gas may enter the gas letdown generator, and the gas may exit as lower-pressure, lower-temperature natural gas. Typically, this gas needs pre-heated or post-heated before the natural gas is delivered to an end user. It should be appreciated that pre-heating may refer to heating the natural gas before the pressure drop or before the letdown generator, and post-heating may refer to heating the natural gas after the pressure drop or after the letdown generator.

Figure 3:
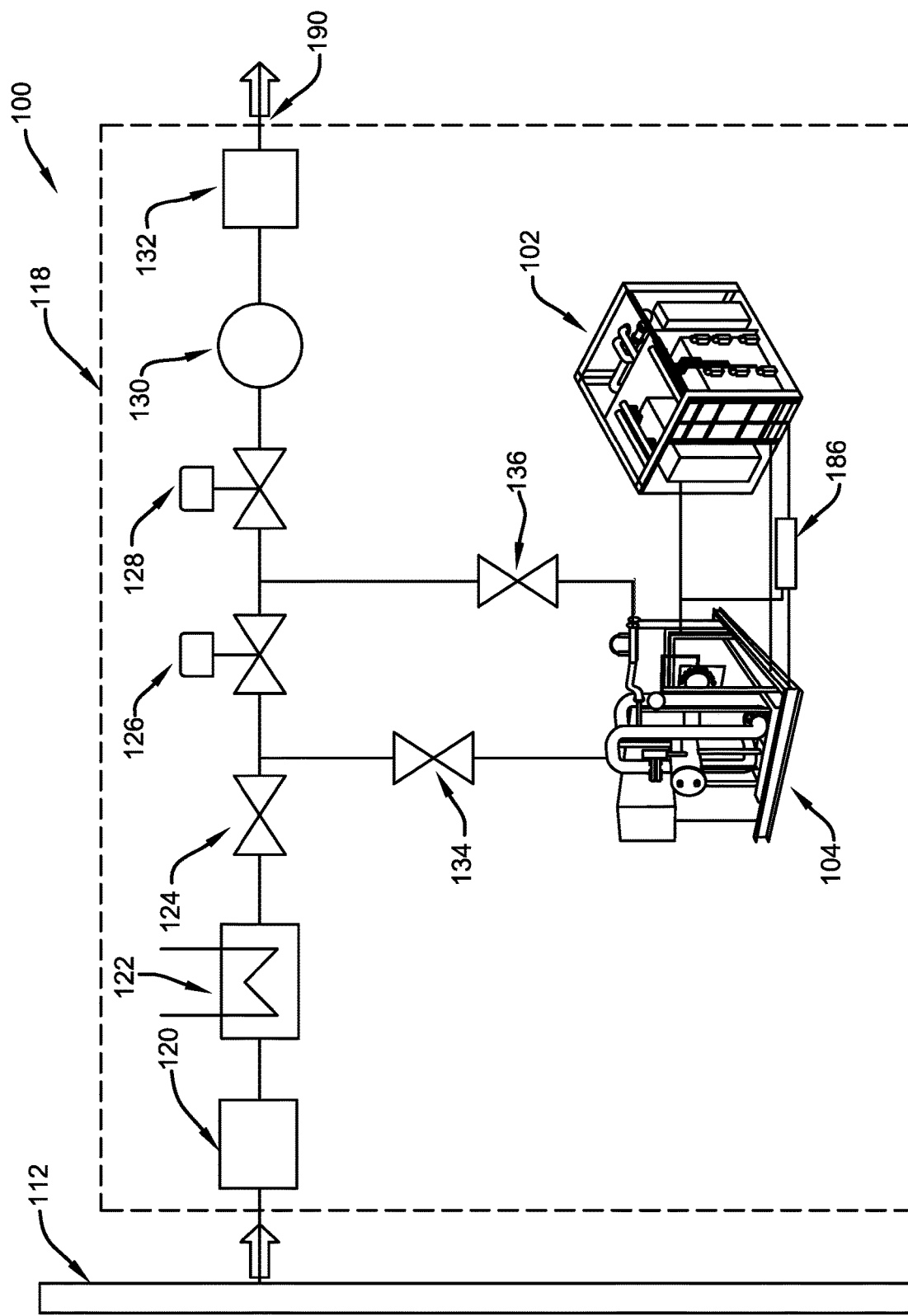
FIG. 3 is an exemplary implementation of a decarbonized natural gas letdown or regulating station utilizing a letdown generator and data center system as described herein.

FIG. 3 illustrates an exemplary implementation of an improved natural gas system utilizing a natural gas letdown generator. The system 100 may include a main natural gas line 12, a letdown system 118, a filter 120, a gas-fired heater 122, a safety shut-off valve 124, a regulator valve 126, a regulator valve 128, a counter 130, and an odorizing system 132. The system 100 can further include a GLG 104, safety valves 134 and 136, a data center 102, and an in-line heater 186. In an implementation, the data center 102 may be an immersion data center. The natural gas system 100 may emit less greenhouse gasses and may be more efficient compared to the system 10. For instance, the system 100 may reduce scope 1 emissions by reducing or eliminating the need for a typical gas pre-heater such as the gas pre-heater 122. In the system 100, the pre-heater 122 is shown, but it should be appreciated that in other implementations, the gas-fired pre-heater 122 may be completely eliminated. Typical natural gas regulation stations, such as station 18, require a pre-heater or a post-heater to increase the temperature of the natural gas before distribution to an end user (e.g., via distribution line 90). As described below, the use of the GLG 104, may mitigate or eliminate the need for a typical pre-heater or a post-heater, which can reduce emissions. For example, the GLG 104 may utilize at least one heat exchanger to transfer heat from the data center 102 to the natural gas and at least one heat exchanger may pre-heat the natural gas prior to the pressure drop caused by the regulator valve 126. Alternatively, or in addition to, at least one heat exchanger may heat the natural gas downstream of the GLG 104 before transmitting to an end user via distribution line 190.

The system 100 may further include an in-line electric heater 186. The in-line heater 186 may heat the natural gas and may be powered by electricity generated from the GLG 104. The in-line heater 186 may be in-line between the GLG 104 and the data center 102 such that the in-line heater 186 can provide heat to the natural gas in addition to the heat exchanger. In certain instances, the in-line heater 186 may provide the entirety of the heating to the natural gas. For example, while the data center 102 is powered off or while the data center 102 is in the process of being powered on, the in-line heater 186 may utilize electricity produced from the GLG 104 to heat the natural gas. As the data center 102 is powered on or brought to operating capacity, heating may be provided by the heat exchangers rather than the in-line heater 186 (e.g., heat transferred from the data center to the natural gas via the heat exchangers without additional heat provided from the in-line heater). It should be appreciated that the system may alternate between the heat exchanger(s) and the in-line heater 186 as necessary (e.g., by alternating heat provided by the in-line heater). The alternating may further include routing the electricity produced from the GLG 104 between either of the data center 102 or the in-line heater 186. In other implementations, a typical gas-fired heater such as gas pre-heater 122 may still be used, however, pre-heating or post-heating provided by the gas pre-heater 122 may be reduced or eliminated by relying on the heating provided by the GLG 104 or the in-line heater 186.

In another example, scope 2 emissions can be reduced or offset by renewable energy credits created by converting wasted pressure to usable or renewable energy. This can be accomplished as the GLG 104 converts high pressure natural gas into electricity. As described in more detail below, the electricity can be used to power a data center such as data center 102. The generated electricity may also be released into a power grid, used to power the in-line heater 186, or any other suitable use.

Additionally, as illustrated in FIG. 3, the safety relief valve 28 of the system 10 can be replaced with a regulator valve 128 to reduce scope 1 emissions. Emissions may be further reduced if the regulator valve 128 is a "no vent" gas regulator, for example. A no vent gas regulator may reduce $CO_2$ emissions.

As described above, the letdown generator 104 may generate electricity to power the immersion data center 102 and/or the in-line heater 186. The system 100 may also utilize the low temperature natural gas exiting the letdown generator 104 to cool the dielectric fluid of the immersion data center 102. In this implementation, the heat produced by the data center 102 may be used to raise the temperature of the natural gas instead of the heat being lost to the atmosphere. The immersion data center 102 may utilize the letdown generator 104 in conjunction with single-phase cooling, two-phase cooling, or any other suitable configuration to transfer heat from the data center 102 to the natural gas.

It should also be appreciated that while the systems disclosed herein refer to a data center 102, other suitable systems may be used in conjunction with or instead of the data center 102. For instance, the system 100 may include a natural gas letdown generator 104 to power other suitable equipment or systems. Other suitable equipment or systems may include greenhouses, various lighting systems, hydrolyzers, air-cooled data centers, air conditioning units, other forms of heaters such as electric heaters, battery charging stations, etc. One skilled in the art will understand that the power generated from the letdown generator 104 may be used to power any form of system and that the data center 102 is just one exemplary implementation of use.

Figure 4:
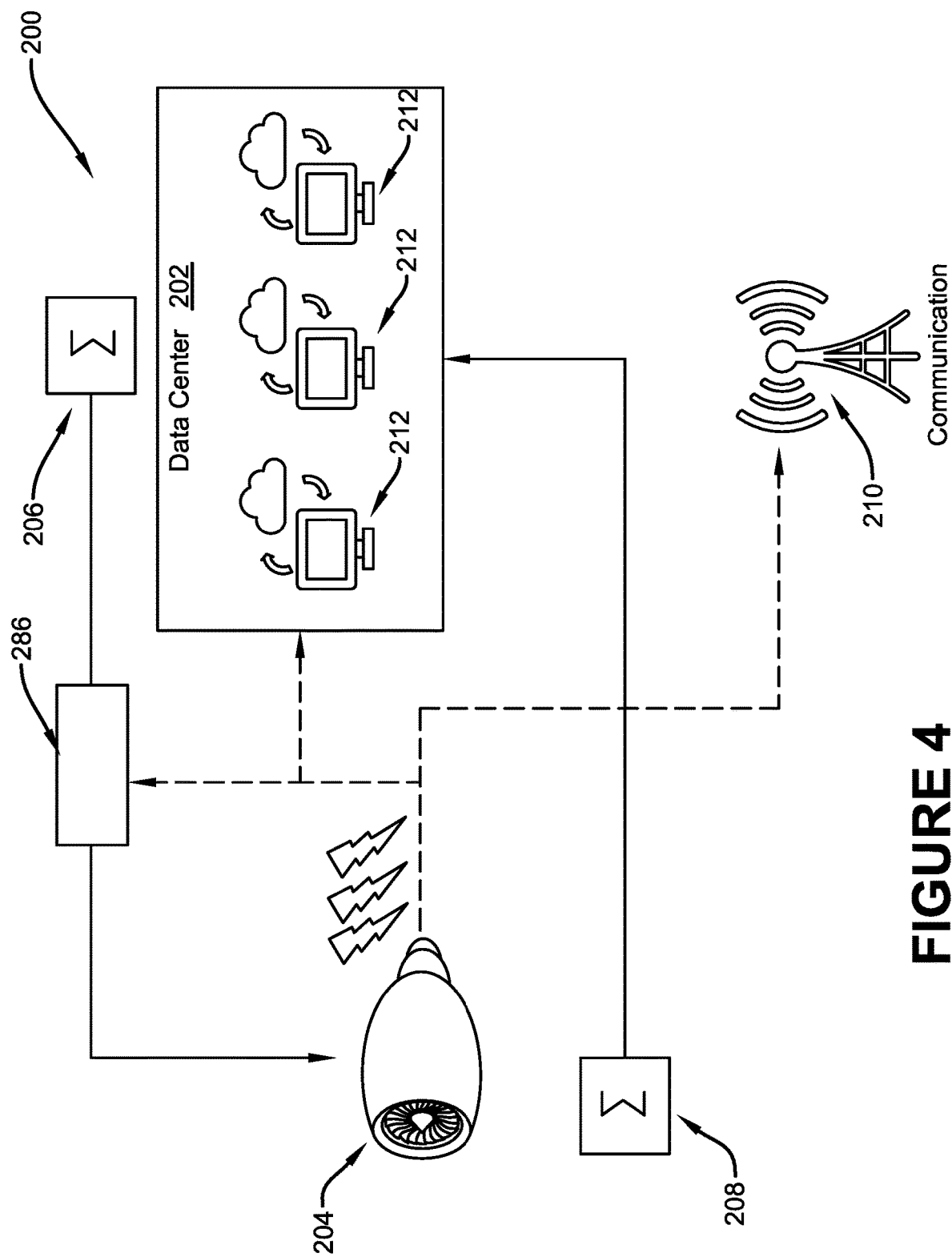
FIG. 4 is an exemplary implementation of a letdown generator and data center system for natural gas regulation as described herein.

Turning to FIG. 4, an exemplary implementation of an improved natural gas system 200 is shown. The system 200 may comprise a data center 202, a gas letdown generator 204, a first heat exchanger 206, a second heat exchanger 208, an in-line heater 286, and a communication system 210. The data center 202 may be an immersion data center comprising various electrical components 212 immersed in a dielectric fluid. The gas letdown generator 204 may be integrated as part of a natural gas regulation system similar to system 10 or 100. In this implementation, the letdown generator 204 operates by receiving a supply of high pressure natural gas at an input of the letdown generator 204. The natural gas flows through a turbo-expander and exits the letdown generator 104 at an output at a lower pressure and temperature than at the input. During the process, electricity may be generated and heat from the data center 102 may be transferred to the natural gas via at least one heat exchanger.

By way of example, a data center is a location or facility that is used to store various computer systems, components, and associated hardware that may be utilized for the storage or hosting of data, applications, computational services and other functions. The physical components of the data center, such as servers, can generate a high amount of heat during operation. Therefore, data centers typically utilize cooling systems to maintain the temperature of the data center and its various components. The cooling systems allow the data center to operate at acceptable temperature levels at all hours of the day to ensure data center components do not fail due to overheating.

Data centers may come in many forms and sizes, and may include various computer systems, hardware, and other components. In general, the data centers may provide storage, host servers, run applications, and may perform other similar computational functions. Servers in a data center use electricity to perform these functions and that electricity is converted into work and heat as a byproduct. Common to all data centers, however, is the need to manage this heat and to maintain a safe and effective temperature of the data center and associated components. High temperatures may lead to failure, damage, or poor operating speeds. Cooling systems can be provided to ensure that data centers and their hardware components are maintained at acceptable temperatures. Cooling systems can include fans, various heat transfer solutions, HVAC systems, outside air circulation, or other solutions. It should be appreciated that cooling systems in data centers may also use additional electricity beyond the electricity use and power requirements of the computers or servers.

Immersion data centers cool hardware components of the data centers by submerging the components into a body or enclosure of thermally-conductive dielectric fluid. Typically, heat is transferred from the hot data center components to the dielectric fluid through direct contact. The dielectric fluid is cooled using a suitable means, such as a heat exchanger. In a dry heat exchanger, as is typically utilized, a least a portion of the heat may be lost to the atmosphere. It should be appreciated that the immersion data center cooling may be in the form of single-phase cooling or two-phase cooling, among others.

By way of example, single-phase cooling may utilize an open loop data center rack (e.g., a server rack) with a circulating dielectric fluid. Server components may be immersed in the dielectric fluid within the rack such that heat is transferred from the server components to the dielectric fluid through direct physical contact. The dielectric fluid may be circulated between the server rack and a cooling mechanism separate from the server rack. The cooling mechanism, such as a heat exchanger, may cool the dielectric before the dielectric fluid is circulated back to the server rack to re-start the cooling process. In a dry heat exchanger, at least a portion of the heat may be lost to the atmosphere.

Two-phase cooling, for example, may utilize a closed loop or sealed data center rack (e.g., server rack). Like the single-phase cooling configuration, the server components may be immersed in dielectric fluid within the rack such that heat is transferred from the server components to the dielectric fluid. In two-phase cooling, however, as heat is transferred from the hot data center components to the dielectric fluid, the dielectric fluid may evaporate (e.g., may change phases to a gas). The evaporated gas flows to the top of the rack where it is re-cooled with a heat exchanger or condenser unit. When the gas is sufficiently cooled, it is returned, as a liquid, to the rest of the fluid in the rack. The heat exchanger may be a water-filled condenser coil, a plate heat exchanger, or any suitable configuration. Similarly, in a dry heat exchanger, at least a portion of the heat may be lost to the atmosphere.

In regard to the data center 202 of system 200, heat may be transferred from the electrical components 212 to the dielectric fluid through direct contact physical contact (e.g., the components 212 may be submersed in dielectric fluid). In two-phase cooling applications, for example, the immersion data center 202 may comprise a heat exchanger to transfer heat from the dielectric fluid to a separate closed loop of coolant (coolant system). The heat from the coolant may be transferred, using the first heat exchanger 206, to the supply of natural gas at the input of the letdown generator 204. Then, natural gas may flow through the letdown generator 204 from the input to an output to generate electricity.

The natural gas exiting the output of the letdown generator 204 may exit at a lower pressure and temperature. Using heat exchanger 208, additional heat may be transferred from the coolant to the low-temperature natural gas at the output of the letdown generator 204. In this manner, the coolant may be cooled a second time before being recirculated back to the immersion data center 202. In other words, heat may be transferred from the electrical components 212 to the dielectric fluid and then to a separate closed loop of coolant. The heat from the coolant may be transferred to the natural gas at the input of the letdown generator 204. The cool natural gas at the output of the letdown generator 204 may be used to chill the coolant a second time before returning to a heat exchanger of the immersion data center 202.

It should be appreciated that the implementation described above may be utilized for single-phase cooling as well. For instance, heat may be transferred from the electrical components 212 to the dielectric fluid through direct physical contact. In single-phase cooling applications, the immersion data center 202 may circulate the dielectric fluid or other suitable coolant between the data center and the gas letdown generator 204. The heat from the dielectric fluid may be transferred, using the first heat exchanger 206, to the supply of natural gas at the input of the letdown generator 204. Then, natural gas may flow through the letdown generator 204 from the input to an output to generate a DC electric current. The natural gas exiting the output of the letdown generator 204 may exit at a lower pressure and temperature. Using the second heat exchanger 208, additional heat may be transferred from the dielectric fluid to the low-temperature natural gas at the output of the letdown generator 204. In this manner, the dielectric fluid may be cooled a second time before returning to the immersion data center 202, and the temperature of the gas exiting the letdown generator 204 may be increased. In certain implementations, the system 200 may include only one heat exchanger (e.g., either of the first heat exchanger 206 or the second heat exchanger 208). It should be appreciated that the system 200 may operate accordingly with either or both of the heat exchangers. In other implementations, any possible number of heat exchangers may be used for either preheating or post-heating the natural gas.

It should be appreciated that the coolant used in the immersion data center 202 system may be any suitable liquid coolant. For example, the coolant may be water, glycol, a water-glycol mix, de-ionized water, oil, dielectric fluids, polyalphaolefin, or other suitable coolants.

Figure 5:
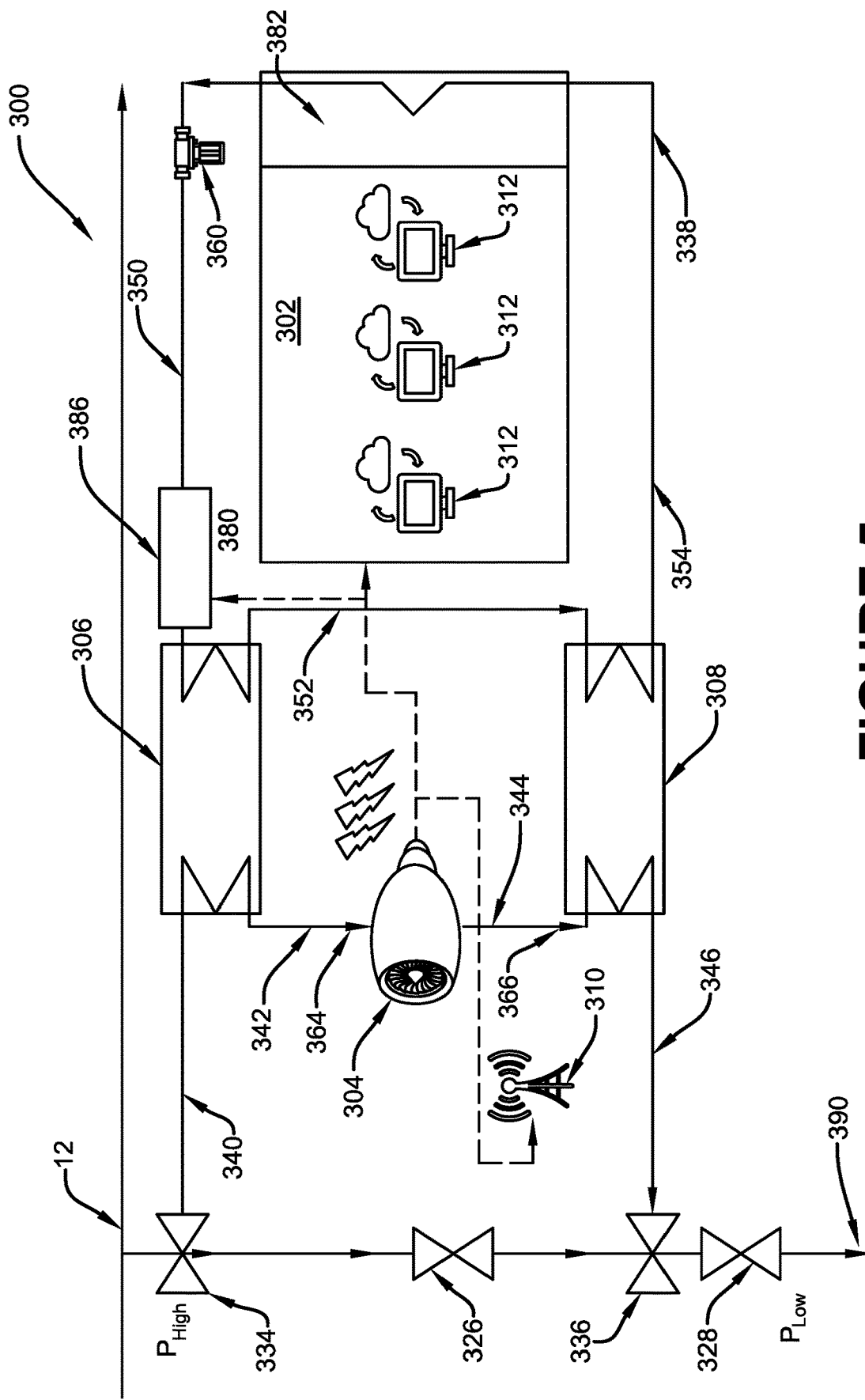
FIG. 5 is another exemplary implementation of a letdown generator and data center system for natural gas regulation as described herein.

FIG. 5 illustrates another implementation of an exemplary system 300 for operating a data center 302. The system 300 may be similar to system 200 in all aspects, except as noted herein, and like reference numerals may be used throughout to denote similar features. The system 300 may comprise a data center 302, a gas letdown generator 304, a first heat exchanger 306, a second heat exchanger 308, an in-line heater 386, a communication system 310, a high pressure natural gas supply line 12, and a pump 360. The data center 302 may be an immersion data center. The letdown generator 304 may be powered by the natural gas supply line 12 that feeds an input 364 of the letdown generator 304. The natural gas may flow through the gas letdown generator 304 and exit the letdown generator 304 at an output 366 of the letdown generator 304 at a lower pressure and temperature than at the input 364.

The immersion data center 302 may comprise a body of dielectric fluid 380, various electrical components 312 suspended in the dielectric fluid 380, a heat exchanger 382, and a closed loop 338 of coolant circulated with pump 360. The heat exchangers 306, 308, 382 may be any suitable type of heat exchanger. For instance, the heat exchangers 306, 308, 382 may be a plate heat exchanger, a shell and tube heat exchanger, a plate and shell heat exchanger, an adiabatic wheel heat exchanger, a plate fin heat exchanger, a finned tube heat exchanger, a pillow plate heat exchanger, or any other suitable heat exchanger.

In an implementation, the letdown generator 304 may generate electricity for the immersion data center 302 and may also be utilized to cool components 312 of the immersion data center 302. Electricity may also be utilized to power the in-line heater 386. The letdown generator 304 may produce DC electric current by the flow of high pressure natural gas from the natural gas source 12. The letdown generator 304 may utilize a flow turbine or helical screw, for example, to convert high-pressure gas from the natural gas source 12 into lower pressure gas, which in turn may generate DC current. Thus, high-pressure natural gas may enter at the inlet 364, and the gas may exit as lower-pressure gas at outlet 366. A constant flow of natural gas from the inlet 364, through the letdown generator 304, and then out of the outlet 366 may produce a steady flow of DC electric current. It should be appreciated, however, that the DC current produced may be converted to any suitable form, voltage, or current output. For instance, the DC current may be converted to AC current using an inverter. The voltage of electricity produced may also be increased or decreased using a transformer.

As described above, gas letdown generators produce power by harnessing power generated from the flow and/or the drop in pressure of the natural gas. The drop in pressure between the inlet 364 and the outlet 366 of the gas letdown generator 304 may cause a significant decrease in temperature (e.g., adiabatic expansion referred to as the Joule-Thompson effect). In most instances, the drop in temperature is too drastic for transmission of the natural gas to locations downstream of the letdown generator (e.g., via distribution line 390). Thus, typical natural gas regulation stations or letdown stations (such as regulation station 18) incorporate a secondary form of heating to heat the natural gas before transmission to end users. The secondary form of heating can be in the form of a pre-heater located upstream of the pressure drop or a post-heater located downstream of the pressure drop. For instance, see pre-heater 22 of system 10. In some examples, pre-heating or post-heating may be performed by burning a portion of the outlet gas to heat up a water bath. The water bath may be used to warm up the remaining flow of gas to a temperature suitable for transmission downstream of station (e.g., via distribution line 390). This typical gas-fired heating process may waste energy and produce emissions (e.g., scope one emissions). Therefore, the typical gas-fired heating by means of a pre-heater or post-heater may be undesirable. Moreover, it should be appreciated that in this application, typical, CO2 emitting, or undesirable methods of pre-heating or post-heating natural gas refer to those methods of pre-heating or post-heating that waste energy or produce emissions. In most cases, these forms of pre-heating or post-heating include the burning of natural gas (e.g., gas-fired; scope one emissions) or the use of electricity from the grid (scope two emissions).

In an implementation, utilizing a natural has letdown generator, such as the generator 304, may eliminate or mitigate the need for CO2 emitting methods of pre-heating or post-heating natural gas as described above. Namely, instead of relying on typical forms of pre-heating or post-heating, the letdown generator 304 may transfer heat from the data center 302 to the natural gas through at least one heat exchanger. Or, the in-line heater 386 may be used to provide heat to the natural gas. This may reduce the need for pre-heating or post-heating using CO2 emitting methods. In some examples, the need for a traditional pre-heater or post-heater may be completely eliminated by the use of letdown generator 304. Instead, the natural gas may be heated via the first heat exchanger 306, the second heat exchanger 308, the in-line electric heater 386, or any other suitable means. It should be appreciated that the in-line electric heater 386 may be powered by electricity generated by the letdown generator 304 to reduce emissions.

Specifically, the heat exchanger 308 may transfer heat from the coolant or dielectric fluid 380 to the natural gas exiting the output 366 of the letdown generator 304. The coolant may be sufficiently cooled and circulated back to the immersion data center 302. The natural gas may be sufficiently heated and transmitted downstream via distribution line 390 to an end user or a natural gas distribution company, for example. Because the natural gas is heated using the first heat exchanger 306, the second heat exchanger 308, or the in-line heater 386, CO2 emitting secondary forms of heating may not be required for system 300. For instance, a natural gas-fired pre-heater or a post-heater may not be required to heat the gas before delivery to end users via distribution line 390, thereby reducing or eliminating scope one emissions and decarbonizing the gas letdown or regulating process. In other examples, the use of a traditional pre-heater or post-heater may still be employed, but the overall use of such heaters may be reduced by the heating provided by the first heat exchanger 306, the second heat exchanger 308 or the in-line heater 386. It should be appreciated that a control system may be programmed to alternate between forms of pre-heating and/or post-heating as required by the real-time requirements of the natural gas pipeline. This is described in detail below with respect to diagram 600.

It should also be appreciated that while the in-line heater 386 is illustrated as being located between the first heat exchanger 306 and the data center 302, the in-line heater 386 may be located in any suitable location. For instance, the in-line heater 386 may be located between the second heat exchanger 308 and the data center 302 or between the first heat exchanger 306 and the second heat exchanger 308. In other implementations, the in-line heater 386 may be located along the natural gas distribution line 390 either upstream or downstream of the letdown generator 302. For example, the in-line heater (or any other suitable electric heater) may be located proximate to or may replace a typical gas-fired heater such as gas-fired heater 22. There may also be plural in-line heaters 386 in any suitable location and combination of locations as listed above.

Moreover, it should be appreciated that although the system 300 is illustrated with a first heat exchanger 306 and a second heat exchanger 308, the system 300 may operate accordingly with either a first heat exchanger 306 or a second heat exchanger 308 without deviating from the scope of the disclosure. The heat exchangers may also be located either upstream or downstream of the letdown generator 304 as determined by sound engineering judgment. Yet in other implementations, any suitable number of heat exchangers may be utilized to achieve desired results. For example, a system such as system 300 may utilize two upstream heat exchangers 306 and one downstream heat exchanger 308. An in-line heater such as in-line heater 386 may be placed either upstream or downstream the heat exchangers without deviating from the scope of the disclosure.

In an implementation, natural gas from the high pressure pipeline 12 may be at a first pressure and a first temperature, illustrated at a location 340 upstream of the heat exchanger 306. The first pressure of the natural gas at location 340 may be 350 PSI, and the first temperature of the natural gas may be 55 degrees F. It should be appreciated, however, that the first pressure of the natural gas may be within a range of 325 PSI and 375 PSI, and the first temperature of the natural gas may be within a range of 45 and 65 degree F.

In this implementation, heat may be transferred from the coolant of the immersion data center 302 to the natural gas using the first heat exchanger 306. The natural gas may be increased from the first temperature to a second temperature and from the first pressure to a second pressure, where the second temperature is higher than the first temperature and the second pressure is higher than the first pressure. In other implementations, however, the pressure of the natural gas may remain substantially unchanged. For instance, the second temperature of the natural gas and the second pressure of the natural gas may be taken at a location 342 proximate the inlet 364. The second pressure of the natural gas at location 342 may be 350 PSI, and the second temperature of the natural gas at location 342 may be 100 degrees F. It should be appreciated, however, that the second pressure of the natural gas may be within a range of 325 PSI and 375 PSI, and the second temperature of the natural gas may be within a range of 90 and 110 degree F.

Continued in this implementation, the natural gas may enter the input 364 of the GLG 304 at the second temperature. The GLG 104 may produce electricity by the flow of natural gas and by inciting a pressure drop. The pressure drop may produce electricity and the natural gas may exit the GLG 304 via the outlet 366. The natural gas may exit the GLG 304 at a third temperature and a third pressure, where the third temperature of the natural gas is lower than the second temperature of the natural gas and the third pressure of the natural gas is lower than the second pressure of the natural gas. For instance, the third temperature of the natural gas and the third pressure of the natural gas may be taken at a location 344 proximate the outlet 366. The third pressure of the natural gas at location 344 may be 125 PSI, and the third temperature of the natural gas at location 344 may be 0 degrees F. It should be appreciated, however, that the third pressure of the natural gas may be within a range of 124 PSI and 126 PSI, and the third temperature of the natural gas may be within a range of −10 and 10 degree F.

In this implementation, the second heat exchanger 308 may transfer heat from the coolant of the immersion data center 302 to the natural gas exiting the GLG 304 at the outlet 366. In this manner, the natural gas may be increased from the third temperature and the third pressure to a fourth temperature and a fourth temperature. The fourth temperature of the natural gas may be greater than the third temperature of the natural gas, and the fourth pressure of the natural gas may be greater than the third pressure of the natural gas. In other implementations, however, the pressure of the natural gas may remain substantially unchanged. For instance, the fourth temperature of the natural gas and the fourth pressure of the natural gas may be taken at a location 346 downstream of the second heat exchanger 308. The fourth pressure of the natural gas at location 146 may be 125 PSI, and the fourth temperature of the natural gas at location 346 may be 50 degrees F. It should be appreciated, however, that the fourth pressure of the natural gas may be within a range of 115 PSI and 135 PSI, and the fourth temperature of the natural gas may be within a range of 40 and 60 degree F.

The coolant from the immersion data center 302 may be at a first temperature and a first pressure illustrated at a location 350. The coolant may flow in a direction illustrated by the arrows in FIG. 5. The coolant may be pumped through the pump 360 such that the coolant flow from the immersion data center 302 to the first heat exchanger 306. The first pressure of the coolant at location 350 may be less than 10 PSI, and the first temperature of the natural gas may be 120 degrees F. It should be appreciated, however, that the first temperature of the coolant may be within a range of 110 and 130 degree F. It should also be appreciated that the pressure of the coolant may remain substantially consistent throughout the coolant loop at 10 PSI or less. For example, the coolant may remain at a pressure of 5 PSI to 15 PSI during normal operation. The coolant may then flow to the first heat exchanger 306, and the first heat exchanger 306 may transfer heat from the coolant to the natural gas. The coolant may be decreased from the first temperature at location 350 to a second temperature at location 352. The second temperature of the coolant may be less than the first temperature of the coolant, and the pressure of the coolant may remain substantially unchanged. For instance, the second temperature of the coolant may be 100 degrees F. it should be appreciated, however, that the second temperature of the coolant may be within a range of 90 degrees F. to 110 degrees F. In certain implementations, the in-line heater 386 may provide additional heating to the coolant prior to entering the first heat exchanger 306. The additional heating provided by the in-line heater 386 may be transferred to the natural gas via the first heat exchanger 306. In this manner, additional heat may be provided to the natural gas when the data center 302 is operating at a reduced capacity or when increased heating is required.

Similarly, the coolant may flow from the first heat exchanger 306 to the second heat exchanger 308 where heat may be transferred from the coolant to the natural gas a second time. In this manner, the coolant may be cooled from the second temperature at location 352 to a third temperature at location 354. For instance, the third temperature of the coolant may be substantially colder than the first and second temperatures of the coolant. The coolant may be recirculated back to the immersion data center 302 at the sufficiently cold temperature.

In an implementation, the recirculated coolant (e.g., at the third temperature) may be used to cool the components 312 of the immersion data center 302. For instance, the coolant may be fed into the heat exchanger 382 of the immersion data center 302. The heat exchanger 382 may transfer heat from the dielectric fluid 380 to the coolant. The coolant may exit the heat exchanger 382 and may be circulated to the first heat exchanger 306 where the process may begin again.

In an implementation, the system 300 may further comprise a natural gas transmission line valve 334, a gas pressure reduction regulator 326, a natural gas distribution valve 336, and a natural gas pressure reduction regulator 328. The natural gas may enter a natural gas end user gas line or local distribution company gas line via distribution line 390.

Figure 6:
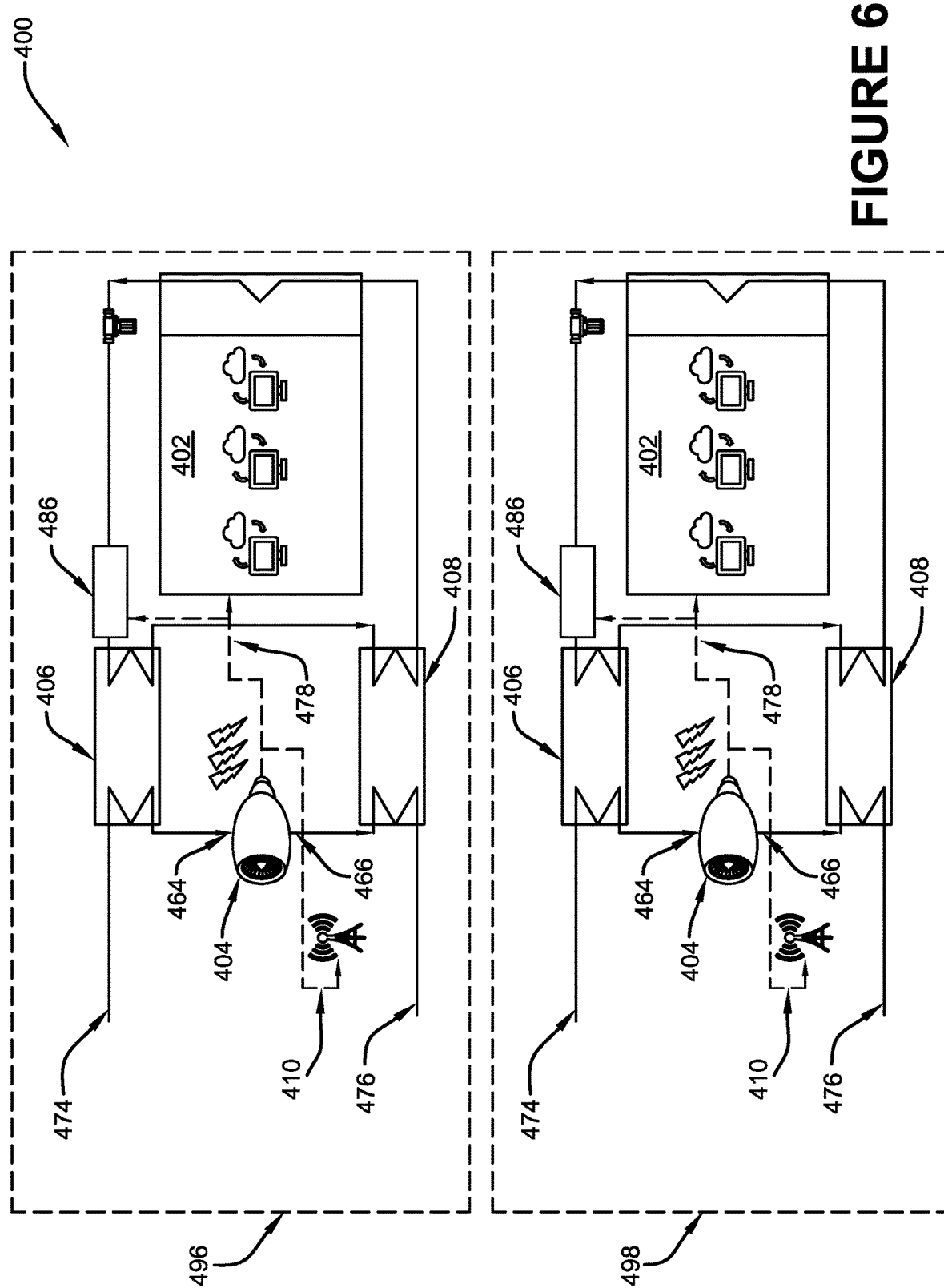
FIG. 6 is an exemplary implementation of a modular and portable gas letdown generator system as described herein.

In another implementation, systems 100, 200, or 300 may be configured as a modular solution that may be transported and installed in separate modules, skids, trailers, or any similar method. For instance, FIG. 6 illustrates an exemplary implementation of a modular system 400 that may be used to power a data center. System 400 may comprise two modular solutions illustrated as a first modular unit 496 and a second modular unit 498. The modular system 400 may include two sets of data centers 402, two gas letdown generators 404, two first heat exchangers 406, two second heat exchangers 408, two in-line heaters 486, and two communication systems 410. System 400 may be configured as a modular solution that may implemented at a natural gas letdown station.

In an implementation, the natural gas inputs 474 may be attached to a high pressure natural gas supply line in a parallel configuration. The high pressure natural gas supply line may supply natural gas to power the GLGs 404. The natural gas may enter the first heat exchangers 406. Heat may be transferred from the coolant to the natural gas. The natural gas may then enter the GLGs 404 at the inputs 464 and may exit from the outputs 466 at a lower temperature than the temperature at the inputs 464. The natural gas may then pass through the heat exchangers 408 where heat may be transferred from the coolant to the natural gas once again. The natural gas may exit the system 400 at the natural gas outputs 476 and may flow to a natural gas provider, for example. It should be appreciated that modular capabilities of the system 400 may allow for any number of GLGs 404 such that the power generation of the system 400 can be configured to match the requirements at throughput of a gas letdown station.

For instance, a gas letdown station may require cooling and/or power generation that requires multiple gas letdown generators 404. The systems 400 may be configured such that the systems can be connected and operated as modular units to a single system 400. In this manner, letdown generator 404 and data center 402 systems can be sized accordingly by selecting an appropriate number of letdown generators 404 or by utilizing multiple letdown generator systems. By way of example, the system 400 may be transported via a skid or trailer having an 8-foot by 30-foot or 8-foot by 50-foot footprint. Such skid or trailer may be easily transported and installed in various letdown stations. By way of example, the first modular unit 496 may be a skid or a trailer, and the second modular unit 498 may also be a skid or a trailer.

In an implementation, the GLGs 404 may produce electricity and may supply power to a data center 302 or in-line electric heaters 486 via outputs 478. The system 400 may further be configured for wireless or wired communication via communication system 410. Communication system 410 may allow for communication and for remote control and monitoring of system 400 and the associated data center and/or in-line heater 486.

Figure 7:
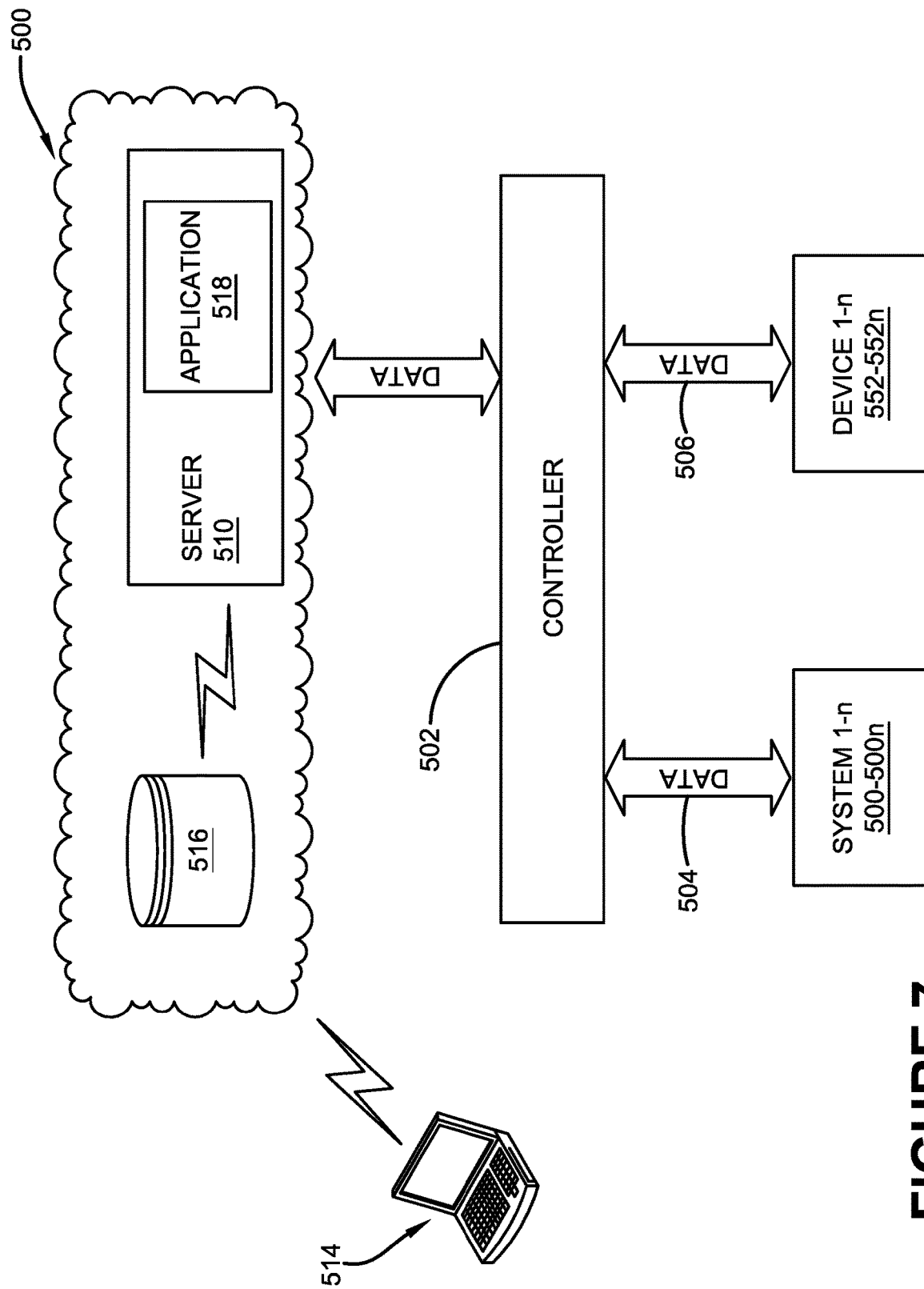
FIG. 7 is an exemplary control system that may be utilized to control any of the implementations of a natural gas letdown or regulation station as described herein.

FIG. 7 depicts an exemplary natural gas control system 500. In various implementations described below, the control system 500 may control any or all aspects of the systems 10, 100, 200, 300, 400. The control system 500 can include a controller 502 configured to communicate with at least one system 550 and at least one device 552. By way of example the system 550 may be a gas letdown generator system such as GLG 104, 204, 304, or 404. The system 550 may also be a natural gas regulation station, a data center, in-line heater system, or any other necessary system. At least one device 552 may be a sensor, flow meter, pressure sensor, temperature sensor, or any other suitable sensor or device that may be required for control of a natural gas system or facility. The controller 502, which can also be referred to as a gateway, can receive data from various devices or systems via a wired or wireless communication link (e.g., such as from communications system 110, 210, 310, etc.). For example, the controller 502 can receive a signal 504 from the system 550 or a signal 506 from the device 552. The controller 502 can be located locally to the various systems and devices or may be located remotely. The controller 502 can send and receive data via the signals 504 or 506, store the corresponding information, and/or perform various processing or calculations with the information.

In certain embodiments, the controller 502 can also communicate the data in a raw or a processed form to a server 510. It should be appreciated that the server 510 can be local, remote, or cloud-based as part of a cloud computing environment 512. In various embodiments, the controller 502 can exist as part of the server 510. The server 510 can also be distributed among multiple locations and/or devices. It is to be appreciated that the server 510 can be at least one of a website, a server device, a computer, a cloud-service, a processor and memory, or a computing device connected to the Internet and connected to a user device 514. In general, a network can be implemented to couple one or more devices of system 500 via wired or wireless connectivity, over which data communications are enabled between devices and between the network and at least one of a second network, a subnetwork of the network, or a combination thereof. It is to be appreciated that any suitable number of networks can be used with the subject innovation and data communication on networks can be selected by one of sound engineering judgment and/or one skilled in the art.

In certain embodiments, the cloud computing environment 512 can also include a database 516. The database 516 can receive information from the server 510 regarding sensor or system information, alerts, notifications, historic information, user information, among other information. The database 516 may be a standalone storage component or it may exist as part of the server 510.

A user device 514 may communicate with the cloud computing environment 512 to send and receive information to and from the server 510 and/or the database 516. The user device 514 may be, for example, a computer, or a mobile device such as a smartphone or tablet, a wearable device, among others. The user device 514 may interact with an application 518 operating on the server 510. When executed, the application 518 can interact with the user device 514 to allow a user to view information, view corresponding notifications or alerts, manipulate information, or update settings for the server 510, application 518, controller 502, system 550 or device 552. The user device 514 can provide a user interface that allows for user interactions with the application 518. It should be appreciated that in certain embodiments, the application 518 may also exist locally on the user device 514 and receive information from the server 510.

One of ordinary skill in the art can appreciate that the various embodiments of the application 518 described herein can be implemented in connection with any computing device, client device, or server device, which can be deployed as part of a computer network or in a distributed computing environment such as the cloud. The various embodiments described herein can be implemented in substantially any computer system or computing environment having any number of memory or storage units, any number of processing units, and any number of applications and processes occurring across any number of storage units and processing units. This includes, but is not limited to, cloud environments with physical computing devices (e.g., servers) aggregating computing resources (i.e., memory, persistent storage, processor cycles, network bandwidth, etc.) which are distributed among a plurality of computable objects. The physical computing devices can intercommunicate via a variety of physical communication links such as wired communication media (e.g., fiber optics, twisted pair wires, coaxial cables, etc.) and/or wireless communication media (e.g., microwave, satellite, cellular, radio or spread spectrum, free-space optical, etc.). The physical computing devices can be aggregated and exposed according to various levels of abstraction for use by application or service providers, to provide computing services or functionality to client computing devices. The client computing devices or user device 514 can access the computing services or functionality via application program interfaces (APIs), web browsers, or other standalone or networked applications. Accordingly, aspects of the application 518 can be implemented based on such a cloud environment. For example, the application 518 can reside in the cloud computing environment 512 such that the computer-executable instructions implementing the functionality thereof are executed with the aggregated computing resources provided by the plurality of physical computing devices. The cloud computing environment 512 provides one or more methods of access to the subject innovation, which are utilized by the application 518. In an embodiment, software and/or a component can be installed on the user device 514 to allow data communication between the user device 514 and the cloud computing environment 512. These methods of access include IP addresses, domain names, URLs, etc. Since the aggregated computing resources can be provided by physical computing device remotely located from one another, the cloud computing environment 512 can include additional devices such as a routers, load balancers, switches, etc., that appropriately coordinate network data.

In an implementation, the control system 500 may be programmed and/or configured to control and implement various aspects of the natural gas systems disclosed herein (e.g., system 10, 100, 200, 300, 400). By way of example, the control system 500 may be programmed to control and read data from valves, meters, sensors, the gas letdown generator, heat exchangers, data center, and any other required device. The control system 500 may also be configured to implement and carry out various methods and logic necessary to operate the various systems disclosed herein.

It should be appreciated that a single control system 500 may be utilized or multiple control systems 500 may be utilized to implement any systems described herein. If multiple control systems 500 are utilized, the control systems may be stand-alone systems or they may communicate with and interact with any or all of the other control systems 500. For example, a first control system 500a may be used to implement and control various aspects of a letdown generator system and a second control system 500b may be used to implement and control various aspects of a data center. Control system 500a and control system 500b may communication with one another to adequately control aspects of a system or station.

Figure 8:
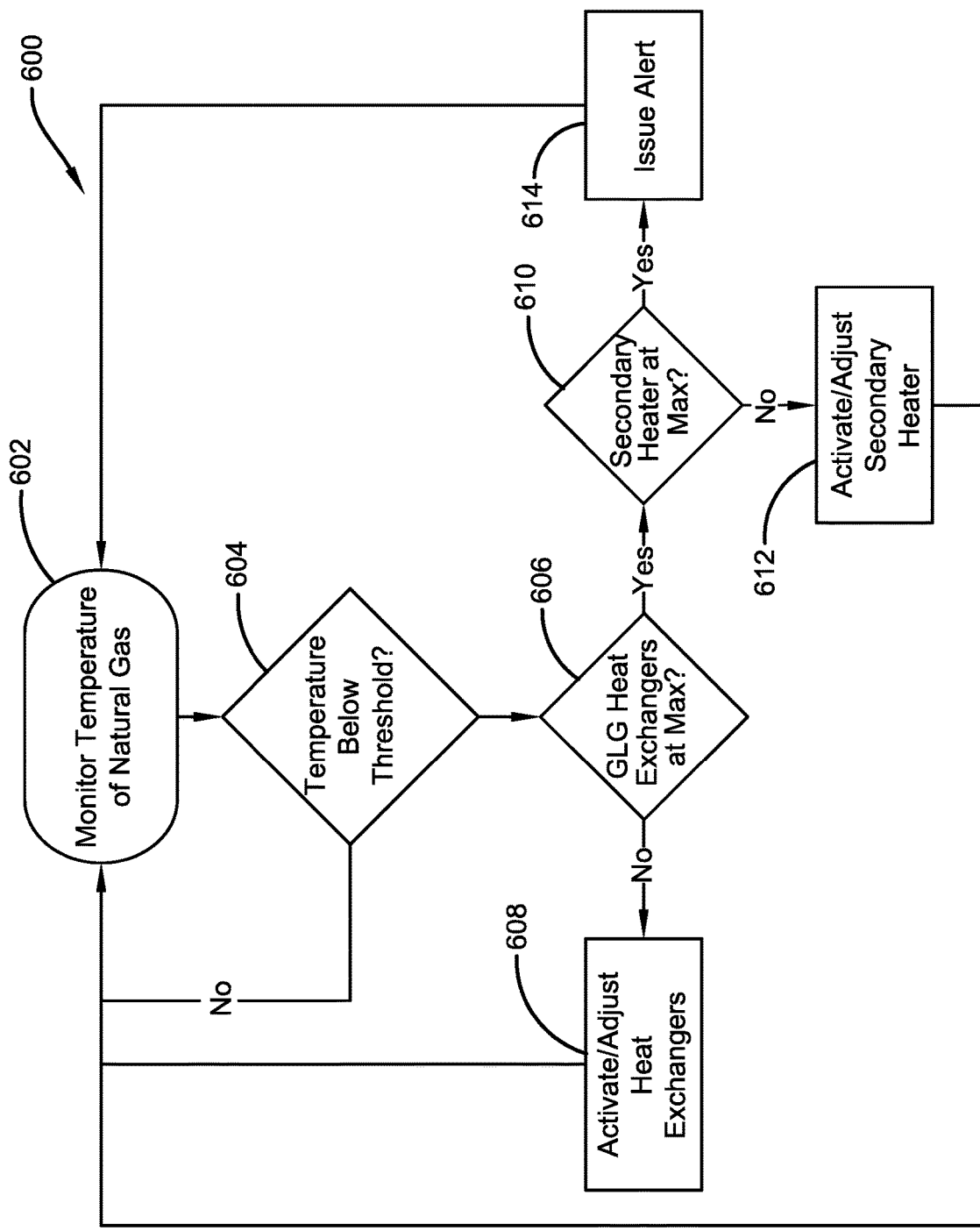
FIG. 8 is an exemplary block diagram illustrating a method of heating natural gas using a gas letdown generator.

FIG. 8 illustrates an exemplary control logic diagram 600 that may be implemented on or carried out by the control system 500. Diagram 600 may be used to illustrate an exemplary natural gas pre-heating and/or post-heating procedure carried out by any of the systems disclosed herein. Diagram 600 may illustrate the control logic carried out by system 500 when a natural gas letdown system includes both a letdown generator as well a secondary form pre-heating or post-heating. As discussed above, natural gas is transported long distances at high pressures. The pressure, however, is typically too high for distribution to end users. Therefore, various natural gas letdown stations are used to decrease the pressure of the natural gas before distribution to an end user. The drop in pressure creates a drastic drop in temperature rendering the natural gas too cold for distribution downstream. In most cases, the natural gas letdown stations utilize a gas-fired pre-heater or post-heater to heat the natural gas to a suitable temperature. The gas-fired pre-heaters or post-heaters burn a portion of natural gas and emit CO2 to the environment. The various systems described herein disclose methods of utilizing a natural gas letdown generator and at least one heat exchanger to heat the natural gas. The use of the letdown generator and at least one heat exchanger may reduce or eliminate the need for gas-fired heaters or other forms of secondary heating. The logic diagram 600 illustrates how the control system 500 may alternate between energy efficient heat exchangers, gas-fired heaters, or other secondary forms of heating to achieve a suitable natural gas temperature while reducing emissions. It should be appreciated that while the examples provided herein relate to heat exchangers and gas-fired heaters, any form of heater or heat exchanger may be used. In other words, the system may be programed to alternate or vary heating between various preferred methods and non-preferred methods to save energy and reduce.

At block 602, the control system 500 may monitor characteristics of the natural gas at various instances in the natural gas letdown system (e.g., system 300). The monitoring of the natural gas may be accomplished by at least one device 552. In this implementation, at least one device 552 may be a temperature sensor and may be used to monitor the temperature of the natural gas at various locations along the system. It should be appreciated, however, that any number of devices and/or sensors may be utilized to determine any suitable characteristic of the natural gas system. For example, the control system 500 may also monitor pressure, flow, leak status, seal status, electricity output, and any other suitable characteristic of the system 300. Moreover, the temperature and other characteristics of the natural gas may be monitored at various instances of the letdown process. For example, the temperature may be monitored at least at locations 340, 342, 344, and 346. The natural gas may be monitored continuously or may be monitored in pre-determined increments. By way of example, the control system 500 may read the temperature of the natural gas from a temperature sensor every 1 second, every 5 seconds, every 60 seconds, etc. Historical data may also be logged and analyzed by the control system 500.

At block 604, the control system may compare the temperature of the natural gas to a pre-determined temperature threshold. In an implementation, the temperature of the natural gas may be read from location 346 and the temperature threshold may be a lower threshold. In other words, if the temperature is below the pre-determined threshold, a positive determination may be made at block 604. For example, a pre-determined lower threshold may be set at 40 degrees F., and a positive determination may be made at block 604 when the temperature of the natural gas at location 346 falls below 40 degrees F. for a set period of time. A negative determination may be made at block 604 when the temperature is above the lower threshold.

It should be appreciated that the temperature of the natural gas may be read from any location of the natural gas system or may be read from a plurality of locations. The temperature threshold may also have an upper and a lower range. For instance, the upper threshold may be 60 degrees F. and the lower threshold may be 40 degrees F. Therefore, when the temperature of the natural gas is outside of the upper or the lower threshold, a positive determination can be made at block 604. A negative determination may be made at block 604 when the temperature is within the upper and the lower threshold.

If the temperature of the natural gas is above the lower temperature threshold or otherwise within the temperature threshold, the system may return to block 602 to continue to monitor the temperature of the natural gas. If the temperature of the natural gas is below the lower temperature threshold, a positive determination is made at block 604 and the logic 600 continues to block 606.

At block 606, the system determines the status of the heat exchangers (e.g., heat exchangers 306 and 308 or other applicable heaters). The status of the heat exchangers may include any suitable characteristic of the heat exchangers, such as, but not limited to: heat exchange rate (operating capacity), temperature, flow rate, active status, inactive status, alarm state, etc. In an implementation, the heat exchangers may operate in either an "active" or an "inactive" state. In an active state, the heat exchangers may be actively exchanging heat between the letdown generator 304 and the data center 302. In an inactive state, the heat exchangers may be determined to have no exchanging of heat between the letdown generator 304 and the data center 302. In other implementations, the heat exchange rate may be variably-controlled (e.g., increased or decreased) based on system requirements. The heat exchange rate may refer to the rate at which heat is transferred between the letdown generator 304 and the data center 302. It should be appreciated that in implementations where the heat exchange rate may be variably-controlled, the temperature of the natural gas may be increased or decreased by controlling the heat exchange rate. In other implementations, where the heat exchange rate may not be variably controlled, the temperature of the natural gas may be increased or decreased by activating or deactivating the heat exchangers 306 and 308.

Block 606 may determine whether or not the heat exchangers 306 and 308 are operating at their maximum capacity. In other words, block 606 may determine whether both heat exchangers 306 and 308 are active. Block 606 may also determine whether both heat exchangers are at their maximum heat exchange rate. Said differently, block 606 may determine if the natural gas temperature may be increased further using the heat exchangers 306 or 308. It should be appreciated that if at least one of the heat exchangers is inactive or operating at only partial capacity, a negative determination may be made at block 606.

If a negative determination is made at block 606, the system may proceed to block 608. In block 608, additional heat may be provided to the natural gas by either activating or increasing the capacity of any or both of the heat exchangers 306 and 308. By way of example, if heat exchanger 306 is active and heat exchanger 308 is inactive, the system may activate heat exchanger 308 to provide additional heating to the natural gas. Likewise, if both heat exchangers 306 and 308 are active, but heat exchanger 306 is operating at 50% capacity, the capacity of heat exchanger 306 may be increased to provide additional heating to the natural gas.

If a positive determination is made at block 606, the system may proceed to block 610. At block 610, the system may determine whether or not secondary forms of heating (e.g., gas-fired heater or in-line heater) is operating at its maximum capacity. In other words, block 610 may determine whether secondary forms of heating are active. Block 610 may also determine whether the secondary heater is operating at its maximum capacity. It should be appreciated that the capacity or heating output provided by the secondary heater may be increased or decreased by providing additional power (e.g., fuel, electricity, etc.) or by reducing the power provided to the secondary heater. Therefore, block 610 may determine if the natural gas temperature may be increased further by increasing the heating rate of the secondary heater. If the secondary heater is inactive or operating at partial capacity, a negative determination may be made at block 610.

If a negative determination is made at block 610, the system may proceed to block 612. At block 612, additional heat may be provided to the natural gas by either activating the secondary heater or by increasing the capacity of the secondary heater. For example, if the temperature of the natural gas is below the threshold and both heat exchangers 306 and 308 are active and operating at their maximum capacity, the secondary heater may be activated to increase the temperature of the natural gas further. It should be appreciated that the secondary heater may be activated but utilized only to the extent necessary to bring the temperature of the natural gas above the temperature threshold. By utilizing the heat exchangers 306 and 308 to the maximum extent possible, the use of the secondary heater can be reduced or eliminated.

If a positive determination is made at block 610, the system may proceed to block 614 to issue a system alert or alarm. The alert or alarm may indicate that all forms of heating (e.g., heat exchangers 306 and 308 and secondary heater) are operating at maximum capacity, but the natural gas temperature is still below the threshold.

In an implementation, the temperature, pressure, and flow of natural gas through the high pressure pipeline 12 and through the letdown generator 304 may fluctuate over time. For example, the flow of natural gas may fluctuate depending on the time of the day, current month, or current season as the demand for natural gas changes. It should be appreciated that the energy/power output of the letdown generator 304 may also fluctuate as the flow (or temperature and pressure) of the natural gas changes. By way of example, more natural gas may flow to the end user during winter months than during the summer months. The electricity/power output from the letdown generator 304 may be greater during times of increased natural gas flow as more natural gas allows for increased energy production.

In another implementation, the control system 500 may be configured to adjust the power usage of the data center 302 as the power generated from the letdown generator 304 fluctuates. The various electrical components of the data center 302 require electricity to operate. This electricity is provided either entirely or partially from electricity generated from the letdown generator 304. Because the electricity generated from the letdown generator 304 may fluctuate over time, the data center 302 may adjust its power consumption in real-time to match the output of the letdown generator 304. The data center may adjust its power consumption by placing at least a portion of the electrical devices 312 into a power saving mode, a reduced operating mode, or may power off devices 312 entirely.

Figure 9:
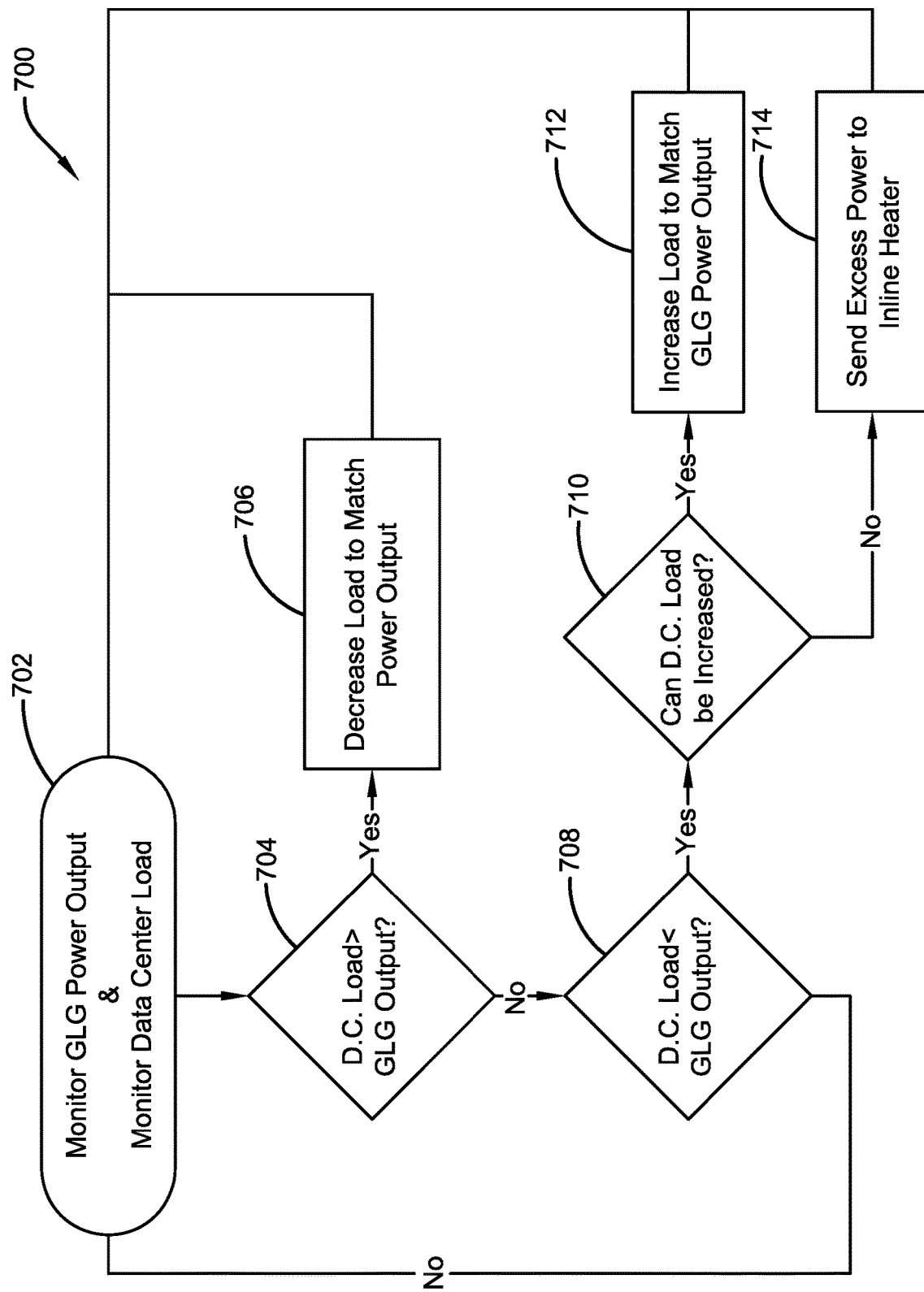
FIG. 9 is an exemplary block diagram illustrating a method of matching the energy load of a data center with the energy output from a letdown generator.

FIG. 9 illustrates an exemplary control logic diagram 700 that may be implemented on or carried out by the control system 500. Diagram 700 illustrates exemplary logic that may be carried out to adjust the power usage of the data center 302 as the power generated from the letdown generator 304 fluctuates. In other words, the control system 500 may match the load from the data center 302 to the power generated by the letdown generator 304. In situations where the load of the data center 302 cannot be increased to match the power output of the letdown generator 304, at least a portion or all of the electricity generated by the letdown generator may be used to power the in-line heater 386.

At block 702, the system may monitor the power characteristics at the gas letdown generator 304 and at the data center 302. The monitoring may be carried out at least in part by one or more devices 552 of the control system 500. In this implementation, the one or more devices 552 may be current sensors, voltage sensors, power sensors, or any other suitable sensor or combination of sensors. The monitoring may indicate the electrical power output by the natural gas letdown generator 304 in kilowatt hours (kWh). For example, at certain times the letdown generator may output 175 kWh of power. At other times, the letdown generator may output 250 kWh of power. Likewise, the monitoring may also indicate the real-time power consumption of the data center 302 in kilowatt hours (kWh).

The system may proceed to blocks 704 and 708 where the power output by the letdown generator 304 is compared to the power usage (e.g., load) of the data center 302. At block 704, the system determines whether the energy consumption of the data center 302 is greater than the energy output of the letdown generator 304. If the energy consumption of the data center 302 is greater than the energy output of the letdown generator 304 the system may proceed to block 706 where the system may decrease the consumption of the data center 302 to match the power output of the letdown generator 304. As discussed above, the data center 302 may reduce its power consumption by placing at least a portion of the electrical devices 312 into a power saving mode, a reduced operating mode, or may power off devices 312 entirely. It should be appreciated that the determination at block 704 may be made with respect to a power consumption threshold rather than using the actual power values. For example, the system may reduce power consumption of the data center 302 if the power consumption is within a pre-determined percentage of the power output by the letdown generator 304. The pre-determined percentage may be 80%, 90%, 95%, or any suitable threshold.

At block 708, the system determines whether the energy consumption of the data center 302 is less than the energy output of the letdown generator 304. If the energy consumption of the data center 302 is less than the energy output of the letdown generator 304 the system may proceed to block 710.

At block 710, the system may determine whether the load of the data center 302 may be increased to match the power output of the letdown generator 304. The data center 302 may be able to increase its load if additional components 312 may be powered on or placed into increased power consumption, etc. If the data center 302 is powered off and cannot be powered on, or if the data center 302 is in the process of powering on, the data center 302 may be unable to provide additional load to utilize the excess power output from the letdown generator 304.

At block 712, the system may increase the consumption of the data center 302 to match the power output of the letdown generator 304. The data center 302 may increase its power consumption by placing at least a portion of the electrical devices 312 into an operating mode, an increased operating mode, or may power on devices 312 entirely. It should be appreciated that the determination at block 708 may be made with respect to a power consumption threshold rather than using the actual power values. For example, the system may increase power consumption of the data center 302 if the power consumption is within a pre-determined percentage of the power output by the letdown generator 304. The pre-determined percentage may be 80%, 90%, 95%, or any suitable threshold.

At block 714, the system may send the excess power generated from the letdown generator 304 to the in-line heater 386. In an implementation, the letdown generator 304 may generate more power than the data center 302 can consume or more power than the maximum power consumption of the data center 302. In this case, there may be excess energy that may be used by other systems. By way of example, excess energy beyond the usage of the data center 302 may be used by the in-line natural gas heater 386 to heat the natural gas. In other examples, the excess power may be grounded or transmitted back into a power grid. It should be appreciated that the power generated by the letdown generator 304 may be used in any suitable manner according to sound engineering judgment.

The foregoing examples and implementations are described with reference to natural gas letdown system 300, but it should be appreciated that the examples are equally relevant to other embodiments as systems described herein. For instance, the logic illustrated in diagrams 600 or 700 may be carried out and implemented for system 10, 100, 200, 400 in a manner similar to the description below for letdown system 300.

Figure 10:
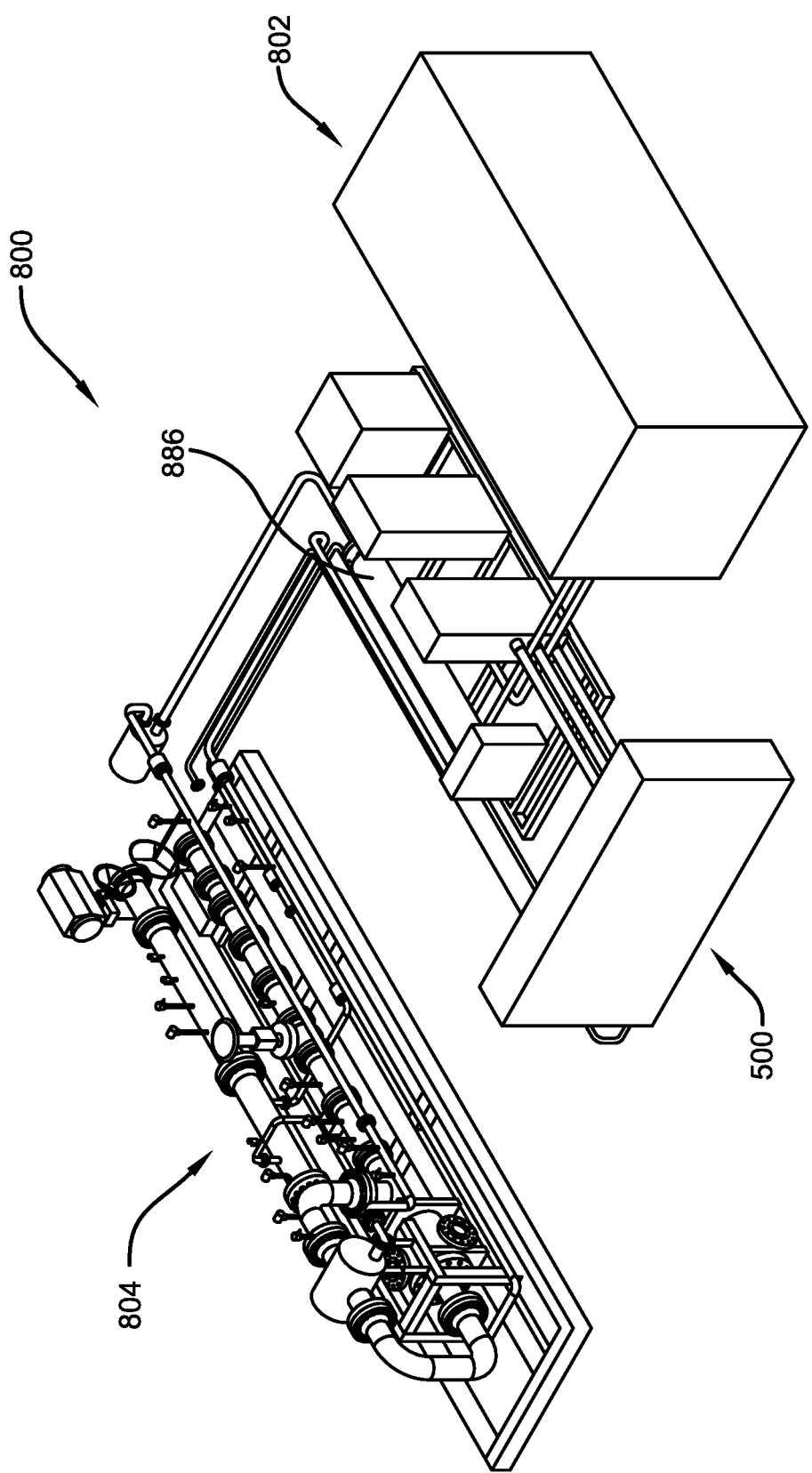
FIG. 10 illustrates an exemplary perspective view of a letdown generator and data center system for natural gas regulation as described herein.
Figure 11:
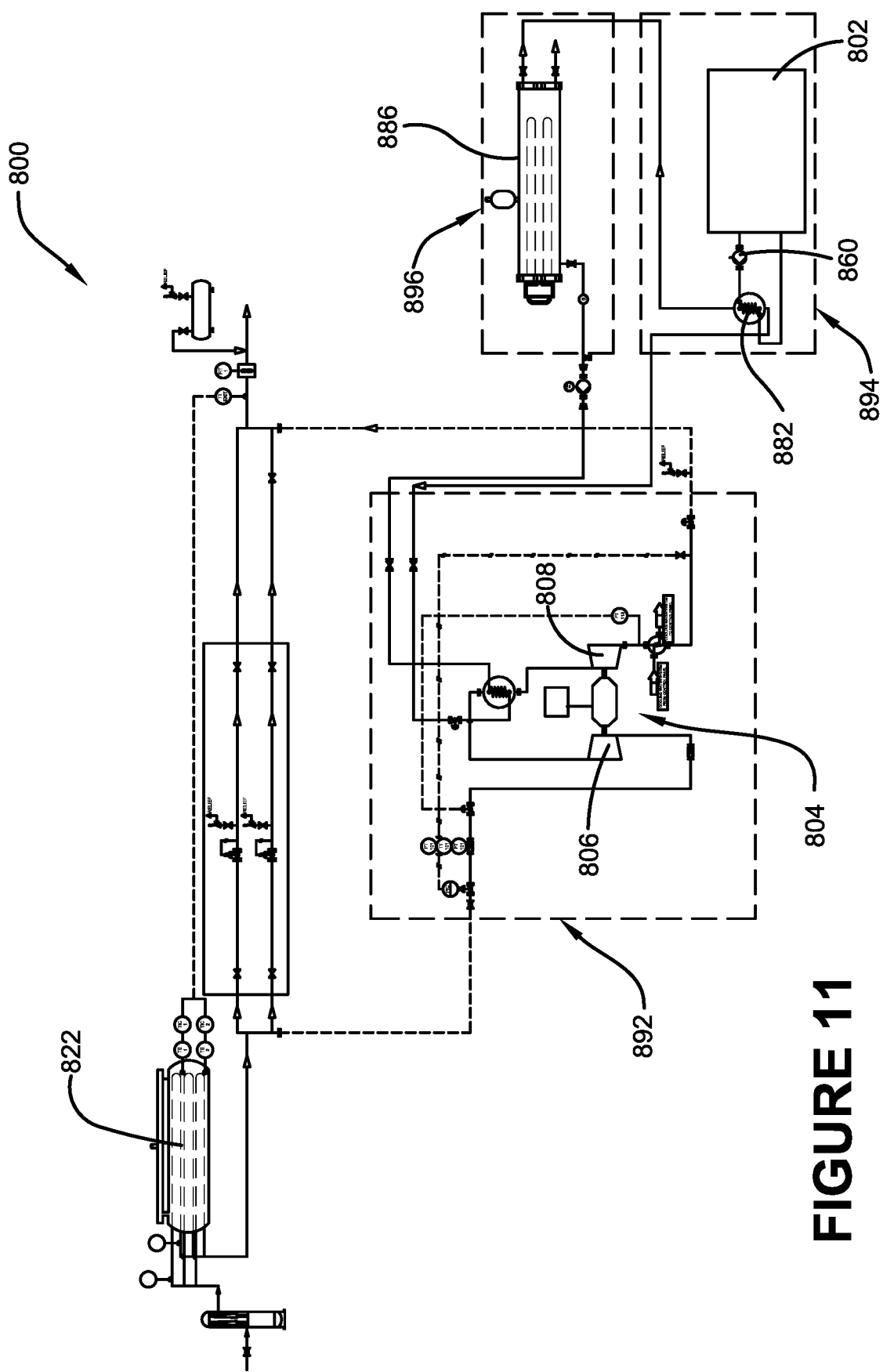
FIG. 11 illustrates a piping diagram of the letdown generator and data center system illustrated in FIG. 10.

FIGS. 10 and 11 illustrate an exemplary implementation of a natural gas letdown system 800. The system 800 is similar in all aspects to systems 100, 200, 300, 400 except as noted herein. Therefore, like reference numerals are used to denote like features with respect to each system. The system 800 includes a natural gas letdown generator 804, a data center 802, an in-line heater 886, and a control system 500. As described above for other implementations, the letdown generator may provide electricity to power the data center 802 and/or to the in-line heater 886. A series of heat exchangers may also transfer heat from the data center 802 to the natural gas either upstream or downstream of the letdown generator 804. In this manner, emissions may be reduced for the natural gas letdown station.

FIG. 11 further illustrates the system 800 by way of a piping diagram that denotes locations and exemplary skid designations for each respective system. For example, skid 892 may designate a skid for the letdown generator 804 and its components. Skid 894 may designate a skid for the data center 802 and its respective components. Similarly, skid 896 may designate a skid for the in-line heater 886 and its respective components. In other implementations, a single skid or trailer may contain the components from the data center 802, the in-line heater 886, and the letdown generator 804.

The word "exemplary" is used herein to mean serving as an example, instance or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Further, at least one of A and B and/or the like generally means A or B or both A and B. In addition, the articles "a" and "an" as used in this application and the appended claims may generally be construed to mean "one or more" unless specified otherwise or clear from context to be directed to a singular form.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. Of course, those skilled in the art will recognize many modifications may be made to this configuration without departing from the scope or spirit of the claimed subject matter.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure.

In addition, while a particular feature of the disclosure may have been disclosed with respect to only one of several implementations, such feature may be combined with one or more other features of the other implementations as may be desired and advantageous for any given or particular application. Furthermore, to the extent that the terms "includes," "having," "has," "with," or variants thereof are used in either the detailed description or the claims, such terms are intended to be inclusive in a manner similar to the term "comprising."

The implementations have been described, hereinabove. It will be apparent to those skilled in the art that the above methods and apparatuses may incorporate changes and modifications without departing from the general scope of this invention. It is intended to include all such modifications and alterations in so far as they come within the scope of the appended claims or the equivalents thereof.

What is claimed is:

1. A natural gas letdown system, comprising:
    a letdown generator comprising an inlet and an outlet, the letdown generator configured to accept a flow of natural gas at the inlet and to output the natural gas at the outlet such that the natural gas that exits the outlet is at a lower temperature and a lower pressure than the natural gas entering the inlet, the letdown generator further configured to generate electricity from the flow of natural gas;
    a data center powered at least in part by the electricity generated by the letdown generator, the data center comprising:
        a body filled with a dielectric fluid;
        a plurality of electrical components located within the body and at least partially immersed in the dielectric fluid, the plurality of electrical components generating heat and the heat is transferred from the plurality of electrical components to the dielectric fluid; and
        a first heat exchanger configured to transfer at least a portion of the heat from the dielectric fluid to a coolant; and
    a second heat exchanger located upstream of the inlet of the letdown generator, the second heat exchanger configured to transfer at least a portion of the heat from the coolant to the natural gas prior to entering the letdown generator; and
    an electric heater powered at least in part by the electricity generated by the letdown generator, the electric heater located between the first heat exchanger of the data center and the second heat exchanger located upstream of the letdown generator and in fluid connection with the coolant, wherein the electric heater is configured to heat the coolant prior to entering the second heat exchanger such that the natural gas is heated prior to entering the letdown generator.

2. The natural gas letdown system of claim 1, wherein the system is configured to heat the natural gas above a pre-determined temperature setpoint using heating provided by the data center or heating provided by the electric heater.

3. The natural gas system of claim 2, wherein the natural gas is heated entirely by either the heating provided by the data center or the electric heater.

4. The natural gas system of claim 1, wherein the data center is an immersion data center.

5. The natural gas letdown system of claim 1, wherein an amount of power generated from the letdown generator is greater than a power consumption of the data center thereby creating a surplus of power, the system configured to send the surplus of power to the electric heater such that the surplus of power is converted to heat.

6. The natural gas letdown system of claim 1, wherein an amount of power generated from the letdown generator is greater than a power consumption of the data center thereby creating a surplus of power, the system configured to send the surplus of power to earth ground.

7. The natural gas letdown system of claim 1, wherein the data center further comprises a circulation pump powered at least in part by the electricity generated by the letdown generator, the circulation pump configured to circulate the coolant through a coolant loop, the coolant loop comprising at least the first heat exchanger, the second heat exchanger, and the electric heater.

8. The natural gas letdown system of claim 1, further comprising a communication system powered at least in part by the electricity generated by the letdown generator, the communication system configured to communicate with a control system, the control system configured to control various aspects of the natural gas letdown system.

9. The natural gas letdown system of claim 1, wherein the natural gas entering the inlet is supplied from a high pressure natural gas pipeline.

10. The natural gas letdown system of claim 9, wherein the natural gas exiting the outlet is transported to an end user via a distribution line.

11. The natural gas letdown system of claim 1, further comprising a natural gas-fired pre-heater located upstream of the letdown generator and configured to heat the natural gas by burning a portion of the natural gas, the system configured to utilize the natural gas-fired pre-heater to heat the natural gas upon the system determining that:
    the temperature of the natural gas exiting the letdown generator is below a pre-determined setpoint;
    the data center is operating at maximum capacity; and
    the electric heater is operating at maximum capacity.

12. The natural gas letdown system of claim 11, wherein the system is further configured to power off the natural gas-fired pre-heater upon determining that the temperature of the natural gas exiting the letdown generator is above the pre-determined setpoint.

13. A method for controlling a natural gas letdown station, the natural gas letdown station comprising:
    a letdown generator comprising an inlet and an outlet, the letdown generator configured to accept a flow of natural gas at the inlet and to output the natural gas at the outlet such that the natural gas that is output from the letdown generator is at a lower temperature and a lower pressure than the natural gas entering the letdown generator, the letdown generator further configured to generate electricity from the flow of natural gas;

a data center powered at least in part by the electricity generated by the letdown generator, wherein the data center comprises a plurality of electrical components and a first heat exchanger, wherein the first heat exchanger configured to transfer the heat from the plurality of electric components to a coolant; and a second heat exchanger located upstream of the inlet of the letdown generator, the second heat exchanger configured to transfer the heat from the coolant to the natural gas prior to entering the letdown generator; and an electric heater powered at least in part by the electricity generated by the letdown generator, the electric heater is configured to heat the coolant prior to entering the second heat exchanger upstream of the letdown generator, wherein the method comprises:

monitoring an amount of power generated by the letdown generator and monitoring a power consumption of the data center; and adjusting the power consumption of the data center to equal the amount of power generated from the letdown generator, wherein the adjusting of the power consumption of the data center comprises powering on or powering off at least one of the plurality of electrical components to increase or decrease the power consumption of the data center respectively.

14. The method of claim 13, wherein the adjusting of the power consumption of the data center further comprises placing one or more of the plurality of electrical components into an increased power state to increase the power consumption of the data center.

15. The method of claim 14, wherein the adjusting of the power consumption of the data center further comprises placing one or more of the plurality of electrical components into an decreased power state to decrease the power consumption of the data center.

16. The method of claim 13, further comprising:
determining that the amount of power generated by the letdown generator is greater than the power consumption of the data center;
determining that the data center is operating at a maximum power consumption resulting in an surplus of power generated by the letdown generator; and
sending the surplus of power to the electric heater.

17. The method of claim 13, further comprising:
determining that the amount of power generated by the letdown generator is greater than the power consumption of the data center;
determining that the data center is operating at a maximum power consumption resulting in an surplus of power generated by the letdown generator; and
sending the surplus of power to earth ground.

18. The method of claim 13, wherein the natural gas letdown station further comprises a natural gas-fired pre-heater located upstream of the letdown generator and configured to heat the natural gas, the method further comprising:

determining that the temperature of the natural gas exiting the letdown generator is below a pre-determined setpoint;

determining that the electric heater is operating at maximum capacity;

determine that the data center is operating at maximum capacity; and upon determining that the temperature is below the pre-determined setpoint, that the data center is operating at maximum capacity, and that the electric heating is operating at maximum capacity, powering on the natural gas-fired pre-heater to heat the natural gas.

19. The method of claim 18, further comprising:
determining that the temperature of the natural gas exiting the letdown generator is above the pre-determined setpoint; and
upon determining that the temperature of the natural gas exiting the letdown generator is above the pre-determined setpoint, powering off the natural gas-fired pre-heater.

20. A natural gas letdown station, comprising:
a letdown generator comprising an inlet and an outlet, the letdown generator configured to generate power using a flow of natural gas, wherein the natural gas enters the inlet at a first temperature and pressure and exits the outlet at a second temperature and pressure, the second temperature and pressure lower than the first temperature and pressure;

an immersion data center powered by the power generated by the letdown generator, the data center comprising:
a body filled with a dielectric fluid;
a plurality of electrical components located within the body and at least partially immersed in the dielectric fluid, the plurality of electrical components generating heat and the heat is transferred from the plurality of electrical components to the dielectric fluid; and
a first heat exchanger configured to transfer heat from the dielectric fluid to a coolant loop; and a second heat exchanger located upstream of the inlet of the letdown generator, the second heat exchanger configured to transfer heat from the coolant loop to the natural gas prior to entering the letdown generator; and an electric heater powered at least in part by the power generated by the letdown generator, the electric heater is located in-line with the coolant loop between and in fluid connection with the first heat exchanger and the second heat exchanger, the electric heater configured to provide heat to the coolant loop prior to entering the second heat exchanger such that the natural gas is heated prior to entering the inlet of the letdown generator.

\* \* \* \* \*